(12) United States Patent
Shibayama

(10) Patent No.: US 11,604,852 B2
(45) Date of Patent: Mar. 14, 2023

(54) SIGNAL PROCESSING APPARATUS, METHOD, PROGRAM, AND RECORDING MEDIUM

(71) Applicant: NEC Corporation, Tokyo (JP)

(72) Inventor: Atsufumi Shibayama, Tokyo (JP)

(73) Assignee: NEC CORPORATION, Tokyo (JP)

( * ) Notice: Subject to any disclaimer, the term of this patent is extended or adjusted under 35 U.S.C. 154(b) by 95 days.

(21) Appl. No.: 16/955,201

(22) PCT Filed: Dec. 26, 2018

(86) PCT No.: PCT/JP2018/047828
§ 371 (c)(1),
(2) Date: Jun. 18, 2020

(87) PCT Pub. No.: WO2019/131754
PCT Pub. Date: Apr. 7, 2019

(65) Prior Publication Data
US 2020/0334321 A1 Oct. 22, 2020

(30) Foreign Application Priority Data
Dec. 27, 2017 (JP) .............................. JP2017-250740

(51) Int. Cl.
*G06F 17/14* (2006.01)
*G06F 7/24* (2006.01)
(Continued)

(52) U.S. Cl.
CPC .............. *G06F 17/142* (2013.01); *G06F 7/24* (2013.01); *G06F 7/523* (2013.01); *G06F 17/16* (2013.01)

(58) Field of Classification Search
CPC .... G06F 17/141; G06F 17/142; G06F 17/156; G06F 17/16; G06F 7/24; G06F 7/523
See application file for complete search history.

(56) References Cited

U.S. PATENT DOCUMENTS 5,148,161 A * 9/1992 Sako ....................... H03M 7/24
341/93
2005/0071403 A1* 3/2005 Taunton .............. G06F 9/30181
708/404
(Continued)

FOREIGN PATENT DOCUMENTS

| JP | S62-221071 A | 9/1987 |
| JP | H07-036666 A | 2/1995 |

(Continued)

OTHER PUBLICATIONS

Patterson et al., Computer Organization and Design, The hardware/software interface, revised fourth edition, Elsevier, 2008, section 7.1 p. 631-632, figure 7.5-7.6, section 7.6, (Year: 2008).*

(Continued)

*Primary Examiner* — Jyoti Mehta
*Assistant Examiner* — Huy Duong

(57) ABSTRACT

A signal processing apparatus comprises an operation processing part that performs operation processing on data represented in the two's complement representation and a storage processing part that performs storage processing on data represented in a second representation format as a data representation format, and in the second representation format, a data value is identical to one in the two's complement representation when the value is positive or zero, and all the bits lower than the most significant bit that indicates the sign in the two's complement representation are inverted when a data value is negative.

4 Claims, 19 Drawing Sheets

(51) Int. Cl.
  *G06F 7/523* (2006.01)
  *G06F 17/16* (2006.01)

(56) References Cited

U.S. PATENT DOCUMENTS

| | | | |
|---|---|---|---|
| 2012/0143936 A1 | 6/2012 | Katayama et al. | |
| 2015/0301986 A1 | 10/2015 | Shibayama | |
| 2015/0363360 A1* | 12/2015 | Shibayama | G06F 17/142 708/300 |
| 2016/0140083 A1* | 5/2016 | Shibayama | H03H 17/02 708/300 |
| 2016/0357706 A1 | 12/2016 | Shibayama | |

FOREIGN PATENT DOCUMENTS

| | | |
|---|---|---|
| JP | H 08-137832 A | 5/1996 |
| JP | 2001-56806 A | 2/2001 |
| JP | 2001-306547 A | 11/2001 |
| JP | 2003-101415 A | 4/2003 |
| JP | 2004-133617 A | 4/2004 |
| JP | 2005-184310 A | 7/2005 |
| JP | 2010-246029 A | 10/2010 |
| JP | 2012-22500 A | 2/2012 |
| JP | 2012-123561 A | 6/2012 |
| WO | 2014/080617 A1 | 5/2014 |
| WO | WO 2015/087497 A1 | 3/2017 |

OTHER PUBLICATIONS

Masaichi, JP 2003011415 (translation version), Sep. 19, 2001, p. 3-18, figures 1-11 . (Year: 2001).*

Japanese Office Action for JP Application No. 2019-562102 dated Mar. 30, 2021 with English Translation.
Internationai Search Report dated Mar. 19, 2019, in corresponding PCT International Application.
J.W. Cooley et al. "An Algorithm for the Machine Calculation of Complex Fourier Series", Mathematics of Computation, vol. 19, No. 90, pp. 297-301, (1965).
D.P. Kolba et al.; "A Prime Factor FFT Algorithm Using High-Speed Convolution", IEEE Transactions on Acoustics, Speech, and Signal Processing, vol. ASSP-25, No. 4, pp. 281-294, (1977).
Japanese Patent Application Publication No. JPH 08-137832 A. An English language abstract of this document is enclosed.
Japanese Patent Application Publication No. JP 2001-56806 A. An English language abstract of this document is enclosed.
Japanese Patent Application Publication No. JP 2012-22500 A. An English language abstract of this document is enclosed.
Japanese Patent Application Publication No. JP 2003-101415 A. An English language abstract of this document is enclosed.
Japanese Patent Application Publication No. JP 2001-306547 A. An English language abstract of this document is enclosed.
WIPO Patent Application Publication No. WO 2015/087497 A1. An English language abstract of this document is enclosed.
Japanese Patent Application Publication No. JP 2010-246029 A. An English language abstract of this document is enclosed.
Japanese Patent Application Publication No. JP 2005-184310 A. An English language abstract of this document is enclosed.
Japanese Patent Application Publication No. JP 2004-133617 A. An English language abstract of this document is enclosed.

* cited by examiner

FIG. 3

| | 2'S COMPLEMENT | SIGN MAGNITUDE | SIGN MAGNITUDE -- |
|---|---|---|---|
| +15 | 01111 | 01111 | 01111 |
| +14 | 01110 | 01110 | 01110 |
| +13 | 01101 | 01101 | 01101 |
| +12 | 01100 | 01100 | 01100 |
| +11 | 01011 | 01011 | 01011 |
| +10 | 01010 | 01010 | 01010 |
| +9 | 01001 | 01001 | 01001 |
| +8 | 01000 | 01000 | 01000 |
| +7 | 00111 | 00111 | 00111 |
| +6 | 00110 | 00110 | 00110 |
| +5 | 00101 | 00101 | 00101 |
| +4 | 00100 | 00100 | 00100 |
| +3 | 00011 | 00011 | 00011 |
| +2 | 00010 | 00010 | 00010 |
| +1 | 00001 | 00001 | 00001 |
| 0 | 00000 | 00000 / 10000 | 00000 |
| -1 | 11111 | 10001 | 10000 |
| -2 | 11110 | 10010 | 10001 |
| -3 | 11101 | 10011 | 10010 |
| -4 | 11100 | 10100 | 10011 |
| -5 | 11011 | 10101 | 10100 |
| -6 | 11010 | 10110 | 10101 |
| -7 | 11001 | 10111 | 10110 |
| -8 | 11000 | 11000 | 10111 |
| -9 | 10111 | 11001 | 11000 |
| -10 | 10110 | 11010 | 11001 |
| -11 | 10101 | 11011 | 11010 |
| -12 | 10100 | 11100 | 11011 |
| -13 | 10011 | 11101 | 11100 |
| -14 | 10010 | 11110 | 11101 |
| -15 | 10001 | 11111 | 11110 |
| -16 | 10000 | | 11111 |

FIG. 6

← CYCLES

| 8 | 7 | 6 | 5 | 4 | 3 | 2 | 1 | |
|---|---|---|---|---|---|---|---|---|
| P 8 | P 7 | P 6 | P 5 | P 4 | P 3 | P 2 | P 1 | |
| 56 | 48 | 40 | 32 | 24 | 16 | 8  | 0 | ps(0) |
| 57 | 49 | 41 | 33 | 25 | 17 | 9  | 1 | ps(1) |
| 58 | 50 | 42 | 34 | 26 | 18 | 10 | 2 | ps(2) |
| 59 | 51 | 43 | 35 | 27 | 19 | 11 | 3 | ps(3) |
| 60 | 52 | 44 | 36 | 28 | 20 | 12 | 4 | ps(4) |
| 61 | 53 | 45 | 37 | 29 | 21 | 13 | 5 | ps(5) |
| 62 | 54 | 46 | 38 | 30 | 22 | 14 | 6 | ps(6) |
| 63 | 55 | 47 | 39 | 31 | 23 | 15 | 7 | ps(7) |

FIG. 7

← CYCLES

| 8 | 7 | 6 | 5 | 4 | 3 | 2 | 1 | |
|---|---|---|---|---|---|---|---|---|
| Q8 | Q7 | Q6 | Q5 | Q4 | Q3 | Q2 | Q1 | |
| 7 | 6 | 5 | 4 | 3 | 2 | 1 | 0 | qs(0) |
| 15 | 14 | 13 | 12 | 11 | 10 | 9 | 8 | qs(1) |
| 23 | 22 | 21 | 20 | 19 | 18 | 17 | 16 | qs(2) |
| 31 | 30 | 29 | 28 | 27 | 26 | 25 | 24 | qs(3) |
| 39 | 38 | 37 | 36 | 35 | 34 | 33 | 32 | qs(4) |
| 47 | 46 | 45 | 44 | 43 | 42 | 41 | 40 | qs(5) |
| 55 | 54 | 53 | 52 | 51 | 50 | 49 | 48 | qs(6) |
| 63 | 62 | 61 | 60 | 59 | 58 | 57 | 56 | qs(7) |

FIG. 9

← CYCLES

|  | 8 | 7 | 6 | 5 | 4 | 3 | 2 | 1 |  |
|---|---|---|---|---|---|---|---|---|---|
|  | P8 | P7 | P6 | P5 | P4 | P3 | P2 | P1 |  |
|  | 56 | 48 | 40 | 32 | 24 | 16 | 8 | 0 | ps(0) |
|  | 57 | 49 | 41 | 33 | 25 | 17 | 9 | 1 | ps(1) |
|  | 58 | 50 | 42 | 34 | 26 | 18 | 10 | 2 | ps(2) |
|  | 59 | 51 | 43 | 35 | 27 | 19 | 11 | 3 | ps(3) |
|  | 60 | 52 | 44 | 36 | 28 | 20 | 12 | 4 | ps(4) |
|  | 61 | 53 | 45 | 37 | 29 | 21 | 13 | 5 | ps(5) |
|  | 62 | 54 | 46 | 38 | 30 | 22 | 14 | 6 | ps(6) |
|  | 63 | 55 | 47 | 39 | 31 | 23 | 15 | 7 | ps(7) |

FIG. 11

| | t0 | t1 | t2 | t3 | t4 | t5 | t6 | t7 | t8 | t9 | t10 | t11 | t12 | t13 | t14 | t15 | t16 |
|---|---|---|---|---|---|---|---|---|---|---|---|---|---|---|---|---|---|
| in0 | 0 | 8 | 16 | 24 | 32 | 40 | 48 | 56 | | | | | | | | | |
| in1 | 1 | 9 | 17 | 25 | 33 | 41 | 49 | 57 | | | | | | | | | |
| in2 | 2 | 10 | 18 | 26 | 34 | 42 | 50 | 58 | | | | | | | | | |
| in3 | 3 | 11 | 19 | 27 | 35 | 43 | 51 | 59 | | | | | | | | | |
| in4 | 4 | 12 | 20 | 28 | 36 | 44 | 52 | 60 | | | | | | | | | |
| in5 | 5 | 13 | 21 | 29 | 37 | 45 | 53 | 61 | | | | | | | | | |
| in6 | 6 | 14 | 22 | 30 | 38 | 46 | 54 | 62 | | | | | | | | | |
| in7 | 7 | 15 | 23 | 31 | 39 | 47 | 55 | 63 | | | | | | | | | |
| 205a | 0 | 8 | 22 | 30 | 36 | 44 | 50 | 58 | | | | | | | | | |
| 205b | 1 | 9 | 23 | 31 | 37 | 45 | 51 | 59 | | | | | | | | | |
| 205c | 2 | 10 | 16 | 24 | 38 | 46 | 52 | 60 | | | | | | | | | |
| 205d | 3 | 11 | 17 | 25 | 39 | 47 | 53 | 61 | | | | | | | | | |
| 205e | 4 | 12 | 18 | 26 | 32 | 40 | 54 | 62 | | | | | | | | | |
| 205f | 5 | 13 | 19 | 27 | 33 | 41 | 55 | 63 | | | | | | | | | |
| 205g | 6 | 14 | 20 | 28 | 34 | 42 | 48 | 56 | | | | | | | | | |
| 205h | 7 | 15 | 21 | 29 | 35 | 43 | 49 | 57 | | | | | | | | | |
| 206a | | | | | | | | | 0 | 8 | 50 | 58 | 36 | 44 | 22 | 30 | |
| 206b | | | | | | | | | 1 | 9 | 51 | 59 | 37 | 45 | 23 | 31 | |
| 206c | | | | | | | | | 16 | 24 | 2 | 10 | 52 | 60 | 38 | 46 | |
| 206d | | | | | | | | | 17 | 25 | 3 | 11 | 53 | 61 | 39 | 47 | |
| 206e | | | | | | | | | 32 | 40 | 18 | 26 | 4 | 12 | 54 | 62 | |
| 206f | | | | | | | | | 33 | 41 | 19 | 27 | 5 | 13 | 55 | 63 | |
| 206g | | | | | | | | | 48 | 56 | 34 | 42 | 20 | 28 | 6 | 14 | |
| 206h | | | | | | | | | 49 | 57 | 35 | 43 | 21 | 29 | 7 | 15 | |
| 207a | | | | | | | | | 0 | 8 | 2 | 10 | 4 | 12 | 6 | 14 | |
| 207b | | | | | | | | | 1 | 9 | 3 | 11 | 5 | 13 | 7 | 15 | |
| 207c | | | | | | | | | 16 | 24 | 18 | 26 | 20 | 28 | 22 | 30 | |
| 207d | | | | | | | | | 17 | 25 | 19 | 27 | 21 | 29 | 23 | 31 | |
| 207e | | | | | | | | | 32 | 40 | 34 | 42 | 36 | 44 | 38 | 46 | |
| 207f | | | | | | | | | 33 | 41 | 35 | 43 | 37 | 45 | 39 | 47 | |
| 207g | | | | | | | | | 48 | 56 | 50 | 58 | 52 | 60 | 54 | 62 | |
| 207h | | | | | | | | | 49 | 57 | 51 | 59 | 53 | 61 | 55 | 63 | |
| out0 | | | | | | | | | 0 | 1 | 2 | 3 | 4 | 5 | 6 | 7 | |
| out1 | | | | | | | | | 8 | 9 | 10 | 11 | 12 | 13 | 14 | 15 | |
| out2 | | | | | | | | | 16 | 17 | 18 | 19 | 20 | 21 | 22 | 23 | |
| out3 | | | | | | | | | 24 | 25 | 26 | 27 | 28 | 29 | 30 | 31 | |
| out4 | | | | | | | | | 32 | 33 | 34 | 35 | 36 | 37 | 38 | 39 | |
| out5 | | | | | | | | | 40 | 41 | 42 | 43 | 44 | 45 | 46 | 47 | |
| out6 | | | | | | | | | 48 | 49 | 50 | 51 | 52 | 53 | 54 | 55 | |
| out7 | | | | | | | | | 56 | 57 | 58 | 59 | 60 | 61 | 62 | 63 | |

FIG. 13

|  | t0 | t1 | t2 |
|---|---|---|---|
| INPUT in0 | 0 | 8 | |
| INPUT in1 | 1 | 9 | |
| SELECTOR 221 | 0 | 9 | |
| FLIP-FLOP 222 | | 0 | 9 |
| FLIP-FLOP 223 | | 1 | 1 |
| SELECTOR 224 | | 0 | 1 |
| SELECTOR 225 | | 8 | 9 |
| OUTPUT out0 | | 0 | 1 |
| OUTPUT out1 | | 8 | 9 |

FIG. 15

|  | 2'S COMPLEMENT | SIGN MAGNITUDE |
|---|---|---|
| +7 | 00000111 | 00000111 |
| +6 | 00000110 | 00000110 |
| +5 | 00000101 | 00000101 |
| +4 | 00000100 | 00000100 |
| +3 | 00000011 | 00000011 |
| +2 | 00000010 | 00000010 |
| +1 | 00000001 | 00000001 |
| 0 | 00000000 | 00000000 |
|  |  | 10000000 |
| -1 | 11111111 | 10000001 |
| -2 | 11111110 | 10000010 |
| -3 | 11111101 | 10000011 |
| -4 | 11111100 | 10000100 |
| -5 | 11111011 | 10000101 |
| -6 | 11111010 | 10000110 |
| -7 | 11111001 | 10000111 |
| -8 | 11111000 | 10001000 |

SIGNAL PROCESSING APPARATUS, METHOD, PROGRAM, AND RECORDING MEDIUM

REFERENCE TO RELATED APPLICATION

This application is a National Stage Entry of international Application No. PCT/JP2018/047828, filed Dec. 26, 2018, which claims priority from Japanese Patent Application No. JP 2017-250740, filed Dec. 27, 2017. The entire contents of the above-referenced applications are expressly incorporated herein by reference.

FIELD

The present invention relates to a signal processing apparatus, method, program, and recording medium.

BACKGROUND

Fast Fourier transform (hereinafter, called as "FFT" hereinafter) processing is one of important processing in digital signal processing. Further, for example, frequency domain equalization (FDE) is known as a technique that compensates for waveform distortion during signal transmission in wireless or wired communication.

In the frequency domain equalization, time domain signal data is first transformed to frequency domain data by fast Fourier transform. Next, a filtering process for equalization is performed. Then, the filtered data is transformed back to time domain signal data by inverse fast Fourier transform (hereinafter called as "IFFT" hereinafter). By the above process, the waveform distortion of the original time domain signal is compensated. Hereinafter, when FFT and IFFT are not distinguished, they will be denoted by "FFT/IFFT."

In general, a "butterfly operation" is used in the FFT/IFFT processing. For example, Patent Literature 1 describes an FFT apparatus and the like using a butterfly operation. Patent Literature 1 also describes "twiddle factor multiplication" (described later), i.e., multiplication using a twiddle coefficient or twiddle factor. Further, the Cooley-Tukey butterfly operation as an efficient FFT/IFFT processing method is described in Non-Patent Literature 1, for example. However, the Cooley-Tukey FFT/IFFT with a large number of points requires a complex circuit. Hence, the FFT/IFFT processing is decomposed into two smaller FFTs/IFFTs by using a Prime Factor method described in Non-Patent Literature 2, for example.

FIG. 14 shows data flow 500 of a 64-point FFT decomposed into a two-stage radix-8 butterfly process by using the Prime Factor method. The data flow 500 includes a data reordering processing part 501, radix-8 butterfly operations are performed a total of sixteen times by butterfly operation processing parts 502 and 503, and a twiddle factor multiplication processing part 504 that multiplies a twiddle factor $\{W^k\}(W=\exp(-2\pi j/N), j^2=-1)$ (the twiddle factors are $(W^0, W^1, \ldots, W^7), \ldots, (W^0, W^7, \ldots, W^{49})$ in FIG. 14).

In the data flow 500 illustrated in FIG. 14, input time-domain data $x(n)$ ($n=0, 1, \ldots, 63$) is Fourier-transformed into frequency-domain signals $X(k)$ ($k=0, 1, \ldots, 63$) by the FFT processing. Note that in FIG. 14, a part of the data flow is omitted. Even when performing IFFT processing, a basic structure of the data flow is the same as the data flow 500 illustrated in FIG. 14.

In a case where the number of FFT points is large, if the entirety of the data flow 500 illustrated in FIG. 14 is to be implemented by a circuit, the circuit will become a huge scale. Therefore, the entirety of the FFT processing is generally implemented by repeatedly utilizing a circuit that implement a partial processing of the data flow according to a required processing performance, in the case where the number of FFT points is large.

For example, in the data flow in FIG. 14, if an FFT apparatus that performs the FFT processing on eight pieces of data in parallel (hereinafter referred to as "in 8-data parallel" for short) is made as a physical circuit, the 64-point FFT processing can be implemented by repeating the processing eight times in total.

Processing repeated eight times is performed sequentially, each corresponding to each of partial data flows 505a to 505h performed on eight pieces of data. More specifically, the processing is performed as follows:

at the first time, the processing corresponding to the partial data flow 505a is performed, at the second time, the processing corresponding to the partial data flow 505b is performed, at the third time, the processing corresponding to the partial data flow 505c (not shown in the drawing) is performed.

Similarly, each of the processing up to the eighth partial data flow 505h is sequentially performed thereafter. The 64-point FFT processing is realized by the processing described above.

In a butterfly operation, a plurality of items of data arranged in a sequential order are read in an order according to a predetermined rule and processed. Therefore, in a butterfly operation, reordering of a plurality of items of data is needed, for which a RAM (Random Access Memory) is mainly used. For example, Patent Literature 2 describes an FFT apparatus that performs reordering of a plurality of items of data using a RAM(s) in a butterfly operation.

Further, for example, Patent Literature 3 describes a speed-up technology utilizing parallel processing of butterfly operations in an FFT operation apparatus with reduced memory usage.

[Patent Literature 1]
Japanese Unexamined Patent Application Publication No. JP-H08-137832A (pp. 3-5, FIG. 25)

[Patent Literature 2]
Japanese Unexamined Patent Application Publication No. JP2001-56806A (Page 5, FIG. 1)

[Patent Literature 3]
Japanese Unexamined Patent Application Publication No. JP2012-22500A (Page 5, FIG. 1)

[Non-Patent Literature 1]
J. W. Cooley, J. W. Tukey, "An Algorithm for the Machine Calculation of Complex Fourier Series," Mathematics of Computation, US, American Mathematical Society, April 1965, Vol. 19, No. 90, pp. 297-301

[Non-Patent Literature 2]
Kolba, "A Prime Factor FFT Algorithm Using High-Speed Convolution," IEEE Trans. On Acoustics, US, IEEE Signal Processing Society, August 1977, Vol. 29, No. 4, pp. 281-294

SUMMARY

Two's complement representation is widely used as a method for representing signal data with binary numbers in digital signal processing. In the two's complement representation, an addition/subtraction processing circuit can be realized with a small circuit scale because subtraction can be represented by addition.

On the other hand, values per bit greatly differ between a small positive value and a small negative value in the vicinity of a value zero in the two's complement representation. As a result, if a signal whose value frequently changes between positive and negative in the vicinity of zero is represented by a two's complement, a bit-wise operation rate (toggle rate) will be large. Dynamic power consumption (dynamic power) P of a digital signal processing circuit realized by a CMOS (Complementary Metal Oxide Semiconductor) circuit can he expressed by the following Equation (1).

$$P=(1/2)*a*C*V^2*f \qquad (1)$$

Where a: circuit operation rate (percentage-activity),

C: load capacity,

V: voltage, and f: operating frequency.

The circuit operation rate (percentage-activity) is given by a ratio of an estimated value of the number of switching times to the number of clock cycles during a certain period of time.

Since a bit-wise operation rate (toggle rate) of signal data determines the percentage-activity a, reducing the bit-wise operation rate is effective in reducing power consumption. Signal data in signal processing for communication often changes between positive and negative in the vicinity of a value zero, As one of important processing in digital signal processing, the fast Fourier transform (FFT) processing handles internal data that often takes a small value near the value zero.

When the two's complement representation is used in the processing, the bit-wise operation rate may become large, resulting in an increased power consumption.

The sign magnitude representation is a method for representing digital data having a small bit-wise operation rate in a vicinity of the value zero. FIG. 15 shows the binary representations of +7 to −8 signal values in 8-bit signal data as an example of the two's complement representation and the sign magnitude representation. In the two's complement representation, bit values of higher-order bits greatly differ between positive and negative values with the value zero as a boundary. As a result, if a signal that frequently changes between positive and negative in the vicinity of the value zero is represented, the bit-wise operation rate will be large.

For example, when a signal value changes from +1 to −1, a seven bits other than the least significant bit (LSB) change.

In the sign magnitude representation, since the most significant bit (MSB) expresses a sign and other bits a magnitude of the value, with the value zero as a boundary, the difference in bit values between positive and negative values is small. Hence, the bit-wise operation rate is small when a signal that frequently changes between positive and negative in the vicinity of the value zero is represented in the sign magnitude representation. For example, when the signal value changes from +1 to −1, only one bit, the most significant bit, changes.

The sign magnitude representation, however, cannot represent subtraction using addition. Therefore, an addition processing circuit and a subtraction processing circuit must be separately provided, which results in an increase of the scale of a circuit that implements addition/subtraction processing. Since the circuit scale determines a load capacity C in the dynamic power consumption P shown in the Equation (1), an increase in the circuit scale increases a power consumption.

That is, compared with the two's complement representation, the sign magnitude representation can reduce the percentage-activity a, but increases the load capacity C of an addition/subtraction circuit. This causes a problem that a. power consumption becomes large, when signal processing involves a significant amount of addition/subtraction processing in particular.

It is conceivable to use the two's complement representation which enables efficient circuit implementation for addition/subtraction processing and use the sign magnitude representation which enables reduction of an operation rate for processing other than addition/subtraction. However, conversion between the two's complement representation and the sign magnitude representation requires bit inversion and one-addition processing (increment processing). This results in a problem that in a case of a circuit requiring a lot of conversion processing, a power consumption increases by that of the conversion circuit.

FIG. 16 illustrates a configuration example of a conversion circuit 600 that performs conversion between the two's complement representation and the sign magnitude representation. The conversion circuit 600 is configured by connecting a bit inversion circuit 601 and a one-addition circuit 602. In the conversion circuit 600, the one-addition circuit 602 in particular has a non-negligible circuit scale, compared with other logic processing circuits and operation processing circuits. Therefore, there is a problem that in a case where a lot of the conversion processing is required, the scale of the circuit and power consumption increase by those of the conversion circuits.

The present invention is invented to solve the problems described above, and it is an object thereof to provide a signal processing apparatus, method, and program, each enabling suppression of increase or reduction of entire circuit scale and power consumption.

According to an aspect of the present invention, there is provided a signal processing apparatus comprising an operation processing part that performs operation processing on data represented in the two's complement representation and a storage processing part that performs storage processing on data represented in a second representation format as a data. representation format, wherein, in the second representation format, a data value is identical to one in the two's complement representation when the value is positive or zero, and all the bits lower than the most significant bit that indicates the sign in the two's complement representation are inverted when a data value is negative.

According to an aspect of the present invention, there is provided a signal processing method including:

performing operation processing on data represented in the two's complement representation; and performing storage processing on data represented in a second representation format as a data representation format, wherein, in the second representation format, a data value is identical to one in the two's complement representation when the value is positive or zero, and all the bits lower than the most significant bit that indicates the sign in the two's complement representation are inverted when a data value is negative.

According to an aspect of the present invention, there is provided a program causing a computer (processor) to execute:

an arithmetic process of performing operation processing on data represented in the two's complement representation; and a storage process of performing storage processing on data represented in a second representation format, wherein a data value is identical to one in the two's complement representation when the value is positive or zero, and all the bits lower than the most significant bit that indicates the sign in the two's complement representation are inverted when a data value is negative. According to the present invention, there is provided a non-transitory computer-readable medium storing the program.

According to an aspect of the present invention, there is provided an apparatus that performs the fast Fourier transform (inverse fast Fourier transform) as signal processing. The fast Fourier transform apparatus (inverse fast Fourier transform apparatus) according to an aspect of the present invention comprises a butterfly operation processing part that performs butterfly operation processing, a twiddle factor multiplication processing part that performs twiddle factor multiplication processing, and a data reordering processing part that rearranges an order of a plurality of pieces of data, and performs processing using both the two's complement representation and a second representation format different from the two's complement representation as data representation formats, in the second representation format, a data value is identical to one in the two's complement representation when the value is positive or zero and all the bits other than the most significant bit that indicates the sign in the two's complement representation are inverted when a data value is negative, the butterfly operation processing part and the twiddle factor multiplication processing part process data represented in the two's complement representation, and the data reordering processing part performs storage processing on data represented in the second representation format.

According to the present invention, there is provided a program causing a processor that performs the fast Fourier transform (inverse fast Fourier transform) on data by executing a butterfly operation process, a twiddle factor multiplication process, and a data reordering process of rearranging an order of a plurality of pieces of data to process data represented in the two's complement representation in the butterfly operation process and the twiddle factor multiplication process, and execute the data reordering process of performing storage processing on data represented in a second representation format, wherein, in the second representation format, a data value is identical to one in the two's complement representation when the value is positive or zero and all the bits lower than the most significant bit that indicates the sign in the two's complement representation are inverted when a. data. value is negative. According to the present invention, there is provided a non-transitory computer-readable medium storing the program.

According to the present invention, it is possible to realize suppression of increase or reduction in circuit scale and power consumption of a signal processing apparatus.

BRIEF DESCRIPTION OF THE DRAWINGS

FIG. 3 is a drawing in a table format showing an example of a data representation format relating to the first example embodiment of the present invention.

FIG. 6 is a diagram schematically illustrating data sets according to a sequential order in FFT processing relating to the second example embodiment of the present invention, FIG. 7 is a diagram schematically illustrating data sets according to a bit reverse order in FFT processing relating to the second example embodiment of the present invention.

FIG. 9 is a diagram schematically illustrating the arrangement of data sets according to the sequential order relating to the second example embodiment of the present invention.

FIG. 11 is a time chart for explaining the operation of a data reordering processing part relating to the second example embodiment of the present invention.

FIG. 13 is a time chart for explaining the operation of the intra-data set rearrangement part 220 relating to the second example embodiment of the present invention.

FIG. 15 is a diagram illustrating an example of data representation formats in a table format.

DETAILED DESCRIPTION

Several example embodiments of the present invention will be described with reference to the drawings.

First Example Embodiment

Figure 1:
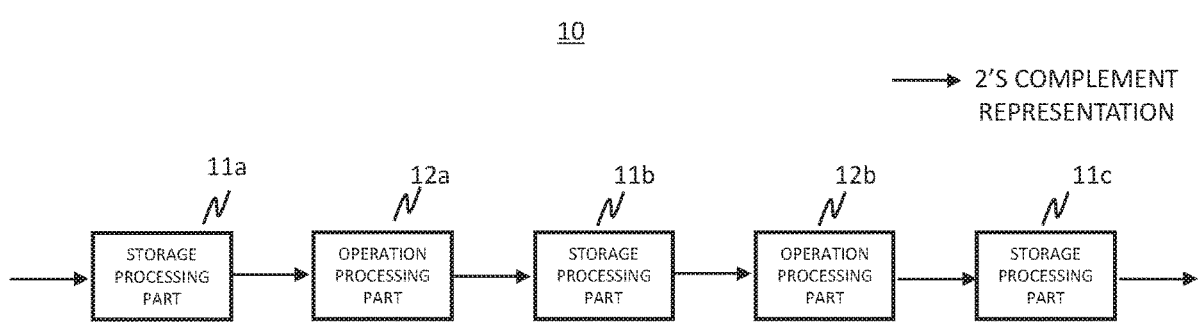
FIG. 1 is a diagram illustrating the configuration of a signal processing circuit relating to a first example embodiment of the present invention.

FIG. 1 is a diagram illustrating a configuration example of a signal processing apparatus 10 of a first example embodiment of the present invention. The signal processing apparatus 10 includes storage processing parts 11a, 11b, and 11c that perform storage processing such as buffering signal data and re-timing and reordering processing, and operation (arithmetic operation) processing parts 12a and 12b that perform operation (arithmetic operation) processing such as addition/subtraction and multiplication/division. It should be noted that arrows in FIG. 1 illustrate the flow of data in processing (it goes without saying that signals between the parts are not always unidirectional). The storage processing parts 11a, 11b, and 11c are referred to as the storage processing parts 11 with the signs a, b, and c omitted except when each part is specified in the description. The same applies to other elements.

The storage processing part 11a receives signal data represented in the two's complement representation from outside (not shown in the drawing) of the signal processing apparatus 10, performs storage processing, and outputs the result to the operation processing part 12a.

The operation processing part 12a receives the signal data represented in the two's complement representation from the storage processing part 11a, performs operation processing, and outputs a result to the storage processing part 11b.

The storage processing part 11b receives the signal data represented in the two's complement representation from the operation processing part 12a, performs storage processing, and outputs the result to the operation processing part 12b.

The operation processing part 12b receives the signal data represented in the two's complement representation from the storage processing part 11b, performs operation processing, and outputs a processing result to the storage processing part 11c, The storage processing part 11c receives the signal data represented in the two's complement representation from the operation processing part 12b, performs storage processing, and outputs the result to the outside of the signal processing apparatus 10.

Figure 2:
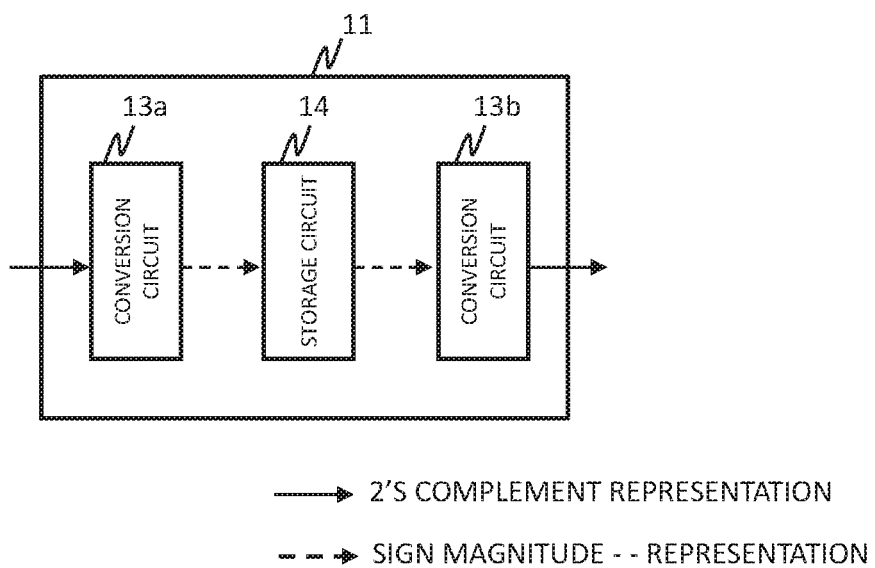
FIG. 2 is a diagram illustrating the configuration of a storage processing part relating to the first example embodiment of the present invention.

For example, the storage processing parts 11a, 11b, and 11c can be realized by a storage processing part 11 illustrated in FIG. 2.

Referring to FIG. 2, the storage processing part 11 includes a first conversion circuit 13a, a storage circuit 14, and a second conversion circuit 13b.

The first conversion circuit 13a is a circuit that converts supplied signal data represented in the two's complement representation into signal data represented in a "sign magnitude-representation," and outputs the result. Note that the "sign magnitude-representation" is a term newly coined by the inventor for the example embodiments and corresponds to the second representation format in the Claims. The "sign magnitude-representation" is identical to the two's complement representation when a data value is positive or zero, but all the bits lower than the most significant bit that indicates the sign in the two's complement representation are inverted when a data value is negative.

FIG. 3 shows the binary representations of +15 to −16 signal values in 5-bit signal data in the sign magnitude-representation, and those in the two's complement and the sign magnitude representations as a comparison. In FIG. 3, positive data values are represented by the same bit values in the sign magnitude-representation, the two's complement representation, and the sign magnitude representation.

The data value zero is represented by the same bit value in the sign magnitude-representation and the two's complement representation.

When a data value is negative, the sign magnitude-representation is obtained by inverting all the bits in the two's complement representation, except for the most significant bit that indicates the sign. Similarly, when a data value is negative, the two's complement representation is obtained by inverting all the bits in the sign magnitude-representation, except for the most significant bit that indicates the sign.

As illustrated in FIG. 3, with the value zero as a boundary, the difference in bit values between positive and negative values is small in the sign magnitude-representation, as in the sign magnitude representation. Therefore, when a signal whose value frequently changes between positive and negative in the vicinity of zero is represented, the bit-wise operation rate is small.

For example, when a signal value changes from +1 ("00001") to −2 ("10001"), only one bit, the most significant bit, changes in the sign magnitude-representation.

Referring to FIG. 2 again, the storage circuit 14 is a circuit that receives signal data represented in the sign magnitude-representation outputted by the first conversion circuit 13a, performs storage processing while staying in the sign magnitude-representation, and outputs the result to the second conversion circuit 13b also while remaining in the sign magnitude-representation.

The second conversion circuit 13b is a circuit that converts the signal data represented in the sign magnitude-representation and outputted by the storage circuit 14 into signal data represented in the two's complement representation, and outputs the result.

Figure 4:
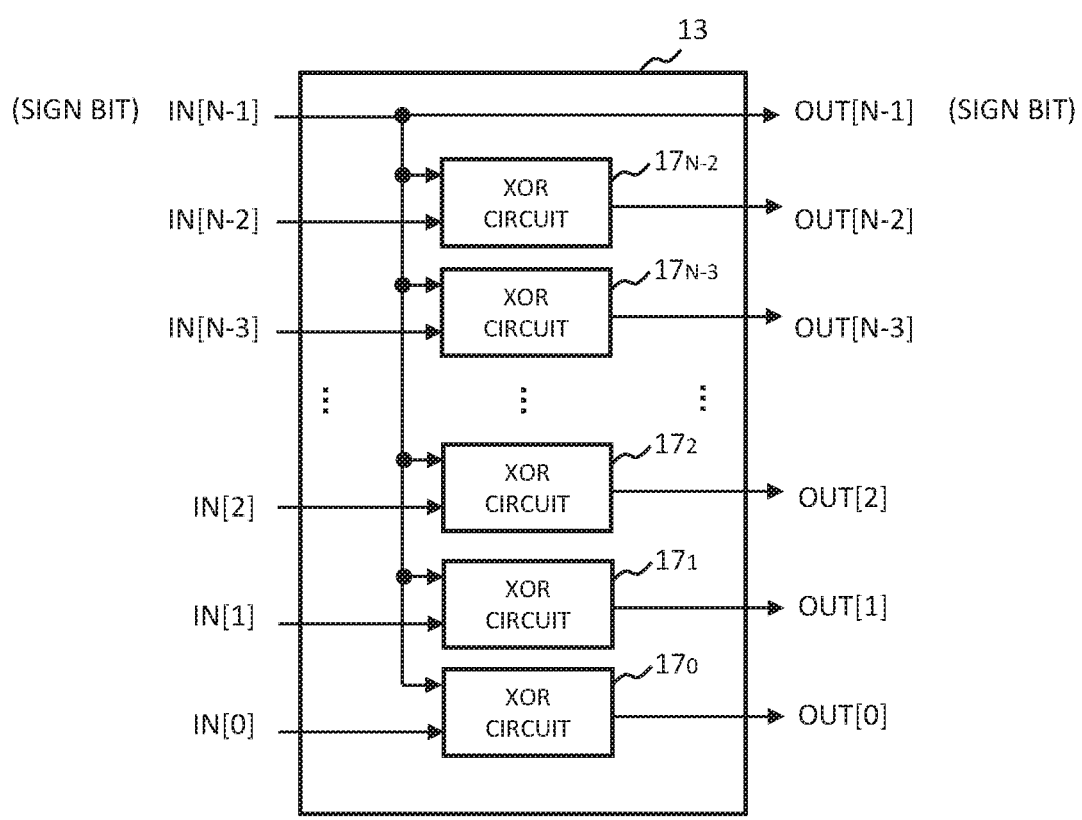
FIG. 4 is a diagram illustrating the configuration of a conversion circuit relating to the first example embodiment of the present invention.

The first and the second conversion circuits 13a and 13b are configured identically and can be realized by a conversion circuit 13 illustrated in FIG. 4 for example. Referring to FIG. 4, the conversion circuit 13 is a circuit that receives in parallel N-bit (N is a positive integer) signal data (IN [0] to IN [N−1]) in the two's complement representation, converts the two's complement representation into the sign magnitude-representation, and outputs the resultant N-bit data (OUT [0] to OUT [N−1]) in parallel. The conversion circuit 13 is a circuit that receives in parallel N-bit signal data (IN [0] to IN [N−1]) in the sign magnitude-representation, converts the sign magnitude-representation to the two's complement representation, and Outputs the resultant N-hit data (OUT [0] to OUT [N−1]) in parallel.

The conversion circuit 13 outputs the most significant hit indicating a sign and received from the input IN [N−1] to OUT [N−1] as a sign bit.

An XOR (exclusive OR) circuit 17 takes XOR between each of the other bits received from the inputs IN [0] to IN [N−2] and the most significant bit received from the input IN [N−1] and indicating a sign, and outputs each result of XOR to each of the outputs OUT [0] to OUT [N−2].

Therefore, when an input data value is positive or zero, the value of the most significant bit received from the input IN [N−1] and indicating the sign is zero, and the data values supplied to the inputs IN [0] to IN [N−2] are outputted as they are to the outputs OUT [0] to OUT [N−2], respectively.

Conversely, when an input data value is negative, the value of the most significant bit received from the input IN [N−1] and indicating the sign is one, and data obtained by inverting the data values supplied to the inputs IN [0] to IN [N−2] with exclusive OR processing is outputted to the outputs OUT [0] to OUT [N−2], respectively.

In the processing described above, the conversion circuit 13 converts the two's complement representation to the sign magnitude-representation and converts the sign magnitude-representation into the two's complement representation.

The conversion circuit 13 achieves conversion between the two's complement representation and the sign magnitude-representation only with bit inversion processing, and does not require one-addition processing, which the sign magnitude representation requires. Since bit inversion can be implemented with exclusive OR operation (XOR circuit), this can be implemented with an overwhelmingly small circuit scale, compared with other logic processing circuits and operation processing circuits.

Figure 17A:
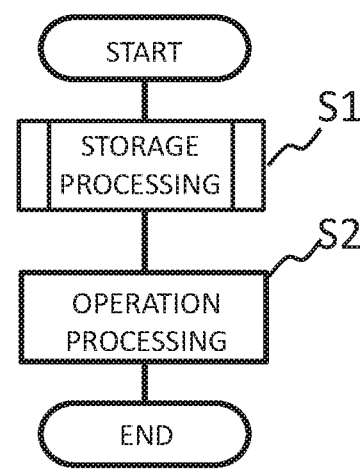
FIG. 17A is a diagram illustrating a mode of a method relating to the present invention.

FIG. 17A is a diagram illustrating a method of the first example embodiment. The method of the first example embodiment includes at least a storage processing step (step S1) of performing storage processing on data represented in the sign magnitude-representation as the data representation format and an operation processing step (step S2) of performing operation processing on data represented in the two's complement representation. The method may further include the storage processing step (the step S1) after the operation processing step (the step S2). Alternatively, the operation processing step may be executed first before the storage processing step.

Figure 17B:
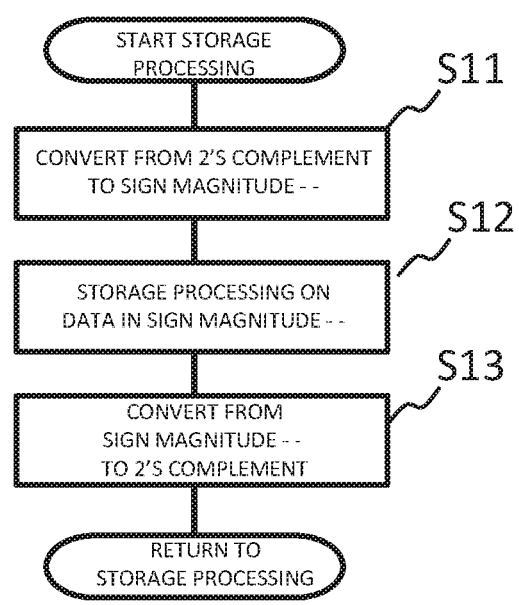
FIG. 17B is a diagram illustrating the procedure of a storage processing step (step S1) in FIG. 17A.

FIG. 17B is a diagram illustrating the procedure of the storage processing step (the step S1) in FIG. 17A, which includes a first conversion step (step S11) of converting the data in the two's complement representation to data in the sign magnitude-representation, a step (S12) of performing storage processing on the data converted into the sign magnitude-representation, and a second conversion step (step S13) of reading the data in the sign magnitude-representation, on which storage processing has been performed, converting the data to data in the two's complement representation to outputting resulting data.

Effect of the First Example Embodiment

As described above, in the storage processing parts 11a, 11b, and 11c, the signal processing apparatus 10 converts data represented in the two's complement representation into data in the sign magnitude-representation, performs storage processing thereon, and then converts the data back to the two's complement representation in the present example embodiment.

As illustrated in FIG. 3, with a value zero as a boundary, the difference in bit values between positive and negative values is small in the sign magnitude-representation, as in the sign magnitude representation. Hence, when a signal whose value frequently changes between positive and negative in the vicinity of zero is represented, the bit-wise operation rate is small. As a result, the percentage-activity in the storage processing parts 11a, 11b, and 11c can be reduced, compared with a case where the processing takes place without converting the two's complement representation.

The conversion circuit 13 achieves conversion between the two's complement representation and the sign magnitude-representation only with bit inversion, and does not require one-addition processing (increment processing), which the sign magnitude representation requires.

Bit inversion can be achieved only with an XOR circuit. Therefore, this can be implemented with an overwhelmingly small circuit scale, compared with other logic processing circuits and operation processing circuits.

Therefore, in the present example embodiment, even when a signal whose value frequently changes between positive and negative in the vicinity of zero is processed, the percentage-activity in the storage processing parts 11a, 11b, and 11c can be kept to a minimum. As a result, the power consumption in the storage processing parts 11a, 11b, and 11c can be reduced.

In the present example embodiment, the operation processing parts 12a and 12b perform operation processing in the two's complement representation. Therefore, the percentage-activity related to operation processing is not reduced. The conversion between the data representation formats, however, does not increase the circuit scale unlike in the case where the sign magnitude representation is applied. Therefore, the power consumption of the entire signal processing apparatus can be reduced by the amount that the power consumption of the storage processing parts 11a, 11b, and 11c is reduced.

In the present example embodiment, although the storage processing parts 11a, 11b, and 11c perform storage processing such as buffering, re-timing, and rearranging signal data in the sign magnitude-representation and the operation processing parts 12a and 12b perform operation processing such as addition/subtraction and multiplication/division in the two's complement representation, the storage processing parts 11a, 11b, and 11c may perform operation processing such as addition/subtraction and multiplication/division, in addition to the storage processing, based on the sign magnitude-representation if desired results can be obtained from processing therein.

Second Example Embodiment

A second example embodiment of the present invention will be described. In the second example embodiment, the present invention is applied to an FFT apparatus. The FFT apparatus includes a butterfly operation processing part that performs butterfly operation processing, a twiddle factor multiplication processing part that performs twiddle factor multiplication, and a data reordering processing part that rearranges an order of a plurality of pieces of data, the butterfly operation processing part and the twiddle factor multiplication processing part process data represented in the two's complement representation, and the data reordering processing part performs storage processing on data. represented in the sign magnitude-representation.

Figure 5:
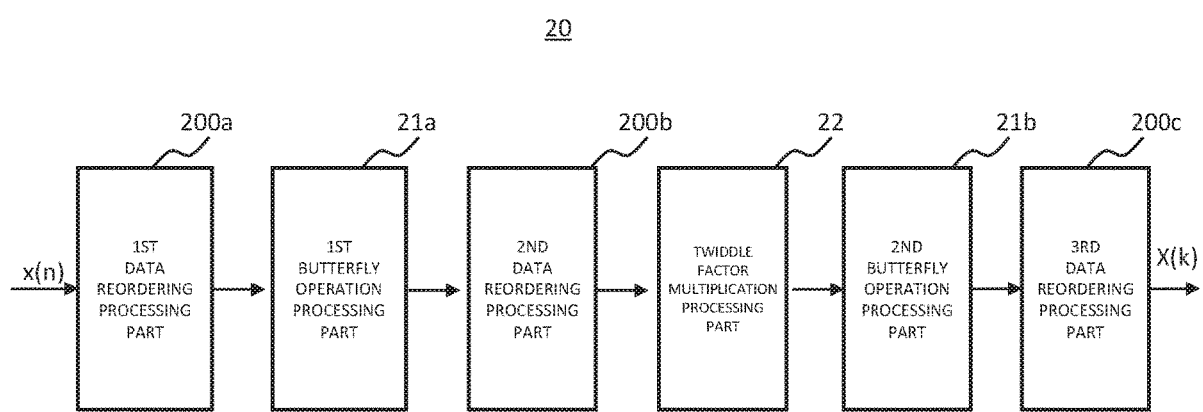
FIG. 5 is a diagram illustrating the configuration of a signal processing circuit relating to a second example embodiment of the present invention.
Figure 14:
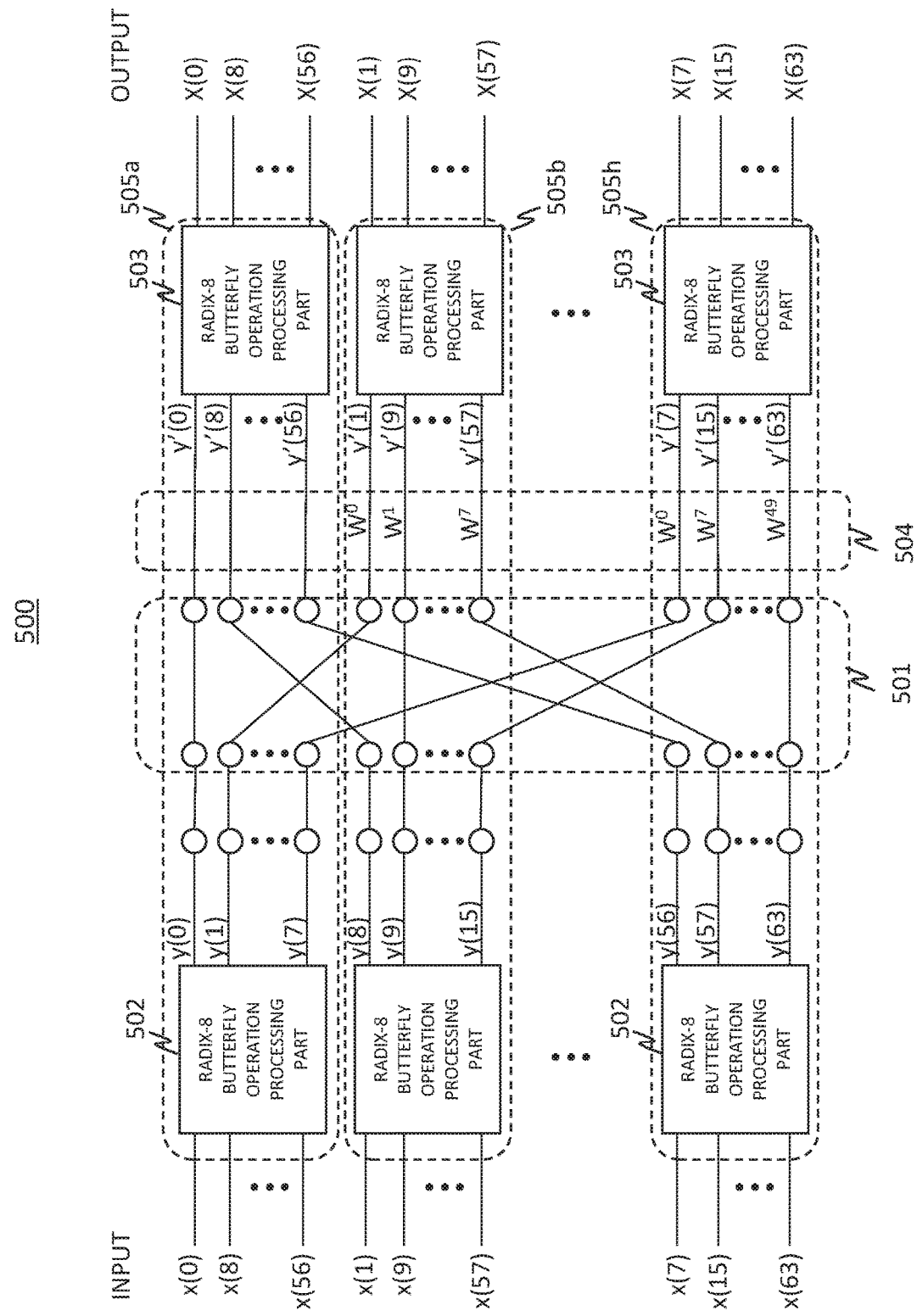
FIG. 14 is a diagram illustrating an example of a 64-point FFT data flow using a two-step butterfly operation.
Figure 16:
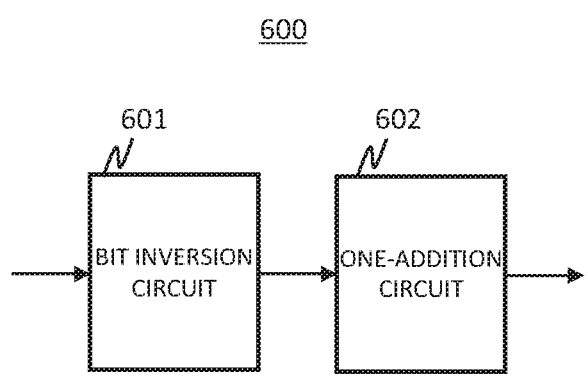
FIG. 16 is a diagram illustrating a configuration example of a conversion circuit.

FIG. 5 is a block diagram illustrating a configuration example of an FFT apparatus 20 relating to the second example embodiment of the present invention, The FFT apparatus 20, using a pipeline circuit system, processes 64-point FFT decomposed into two-stages of radix-8 butterfly processing, according to the data flow 500 illustrated in FIG. 14. The FFT apparatus 20 receives time-domain data x(n) (n=0, 1, . . . , N−1), performs Fourier-transformation on x(n) using FFT processing, and generates and outputs frequency-domain signals X(k)=0, 1, . . . , N−1). Here, N is a positive integer representing the FFT block size. It is assumed that the FFT apparatus 20 performs a 64-point FFT process in 8-data parallel (N=64), as a non-limiting example. In this case, the FFT apparatus 20 receives the time-domain data x(n), and generates and outputs the frequency-domain signals X(k), which have been Fourier-transformed using FFT processing. 64 pieces of data in total, eight pieces at a time in eight cycles, are entered as the input data x(n) in the order illustrated in FIG. 6. The numbers from 0 to 63 (eight rows×eight columns of elements) shown as contents of a table in FIG. 6 represent an index n of x(n).

More specifically, in the first cycle, eight pieces of data x(0), x(1), . . . , and x(7) constituting a data set P1 are entered.

Then, eight pieces of data x(8), x(9), . . . , and x(15) constituting a data set P2 are entered in the second cycle. Similarly, in each cycle from the third to the eighth, data constituting data sets P3 to P8 are entered thereafter, respectively.

Likewise, 64 pieces of data, eight pieces of data at a time in eight cycles, are outputted as output data. X(k) in the order illustrated in FIG. 6. Note that the numbers from 0 to 63 shown in the table in FIG. 6 represent an index k of X(k).

More specifically, in the first cycle, eight pieces of data x(0), x(1), . . . , and x(7) constituting the data set P1 are outputted.

Eight pieces of data x(8), x(9), . . . , and x(15) constituting the data set P2 are outputted in the second cycle. Similarly, in each cycle from the third to the eighth, data constituting the data sets P3 to P8 are outputted thereafter, respectively.

As illustrated in FIG. 5, the FFT apparatus 20 includes a first data reordering processing part 200a, a first butterfly operation processing part 21a, a second data reordering processing part 200b, a twiddle factor multiplication processing part 22, a second butterfly operation processing part 21*b*, and a third data reordering processing part 200*c*.

The FFT apparatus 20 performs first data reordering processing, first butterfly operation processing, second data reordering processing, twiddle factor multiplication processing, second butterfly operation processing, and third data reordering processing, in pipeline processing.

The first data reordering processing part 200*a* and the second data reordering processing part 200*b* include buffer circuits that rearrange data. The first data reordering processing part 200*a* and the second data reordering processing part 200*b* rearrange a data sequence before and after the first butterfly operation processing part 21*a*, respectively, based on data dependency in an FFT processing algorithm.

Likewise, the third data reordering processing part 200*c* is a buffer circuit that rearranges data. In other words, the third data reordering processing part 200*c* rearranges a data sequence after the second butterfly operation processing part 21*b* based on the data dependency in an algorithm of the FFT processing.

More specifically, the first data reordering processing part 200*a* rearranges a "sequential order" illustrated in FIG. 6, which is the input order of the input data x(n), into a "bit reverse order" illustrated in FIG. 7, the order in which the data is supplied to the first butterfly operation processing part 21*a*.

The bit reverse order illustrated in FIG. 7 corresponds to input data sets supplied to the radix-8 butterfly operation processing part 502 in the first stage in the data flow diagram illustrated in FIG. 14, More specifically, in a first cycle, eight pieces of data x(0), x(8), . . . , and x(56) constituting a data set Q1 are entered. Then, eight pieces of data x(1), x(9), . . . , x(57) constituting a data set Q2 are entered in a second cycle. Similarly, in each cycle from a third to an eighth, data constituting data sets Q3 to Q8 are entered thereafter, respectively.

The sequential order denotes the order of the eight data sets P1, P2, P3, P4, P5, P6, P7, and P8 as illustrated in FIG. 6. A data set Ps (where s is a value representing the order of a processing cycle; s=1, 2, . . . , 8) is constituted by eight pieces of data sequentially arranged from ps(0) to ps(7). When x(0) to x(63), 64 pieces of data in total, eight pieces at a time in eight cycles, are entered in the order illustrated in FIG. 6, ps(i) (i=0, . . . , 7) is given as follows.

$$ps(i)=x[8\times(s-1)+i]$$

The data sets are arranged in the order of P1, P2, P3, P4, P5, P6, P7, and P8 corresponding to the progress of the processing cycles. In the "sequential order," s sets of data sets are created by sequentially arranging i·s pieces of data from the first set, by every i pieces of data in the order of data, and the data sets are arranged in the order of cycles.

The bit reverse order denotes the order of the eight data sets Q1, Q2, Q3, Q4, Q5, Q6, Q7, and Q8 illustrated in FIG. 7. A data set Qs (where s is a value representing the order of a processing cycle; s=1, 2, . . . , 8) is constituted by eight pieces of data sequentially arranged from qs(0) to qs(7). For 64 pieces of data x(0) to x(63) supplied in the sequential order, qs(i) (i=0, . . . ,7) is given as follows.

$$qs(i)=x[(s-1)+8\times i]$$

The data sets are arranged in the order of Q1, Q2, Q3, Q4, Q5, Q6, Q7, and Q8 corresponding to the progress of the processing cycles. In the bit reverse order, s pieces of i·s pieces of data supplied in the sequential order are arranged from the first piece in the order of cycles, and i pieces of data in the same cycle are sequentially arranged as a set.

Each data set in the bit reverse order is uniquely determined if each data set in the sequential order is configured. The i-th data Qs(i) (i=0, . . . , 7) out of data constituting each data set Qs (s=1, . . . , 8) in the bit reverse order is the (s−1)-th piece of data Pi+1 (s−1) in the (i+1)-th cycle according to the sequential order. That is, $$Qs(i)=Pi+1(s-1)$$

Here, if the i-th data in Ps and Qs (s=1, . . . , 8) are represented by Ps(i) and Qs(i) (i=1, . . . , 8), the above equation is expressed as:

$$Qs(i)=Pi(s).$$

In other words, Qs(i) and Pi(s) have a relationship in which the progress order of cycles is replaced by the order of data positions with respect to pieces of data constituting each data set. Hence, if pieces of data supplied in the bit reverse order are rearranged according to the bit reverse order, they will form a sequence in the sequential order.

Each row ps(i) in FIG. 6 and eight rows qs(i) in FIG. 7 represent the i-th data to be supplied in the subsequent stage. Each of eight numerals included in each data set is an identifier specifying an FFT point, and is specifically the index n in x(n).

Note that the sequential order and the bit reverse order are not limited to those illustrated in FIGS. 6 and 7. Each data set in the sequential order can be created by sequentially arranging data according to the number of FFT points, the number of cycles, and the number of data processed in parallel, as described above. Each data set in the bit reverse order can be created by replacing the order of cycle progression with the order of data position, for data supplied in the sequential order, as described above.

The first butterfly operation processing part 21*a* is the butterfly operation processing part that performs the first butterfly operation processing 502 (the first butterfly operation process) of the two radix-butterfly operation processing performed in the data flow 500 illustrated in FIG. 14.

The first butterfly operation processing part 21*a* outputs the results of the butterfly operation in the sequential order illustrated in FIG. 6 as data y(n) (n=0, 1, . . . , 63).

The second data reordering processing part 200*b* rearranges the data y(n) outputted in the sequential order by the first butterfly operation processing part 21*a* into the bit reverse order as illustrated in FIG. 7 in order to supply the data to the second butterfly operation processing part 21*b*.

The twiddle factor multiplication processing part 22 is a circuit that handles complex rotation on a complex plane in an FFT operation after the first butterfly operation, and corresponds to the twiddle factor multiplication processing part 504 in the data flow 500 illustrated in FIG. 14. Data rearrangement is not performed in the twiddle factor multiplication process, The second butterfly operation processing part 21*b* corresponds to a butterfly operation processing circuit that performs the second process by the radix-8 butterfly operation processing part 503 in the data flow diagram illustrated in FIG. 14. The second butterfly operation processing part 21*b* performs the butterfly operation processing on data y'(n) (n=0, 1, . . . , 63) supplied in the bit reverse order after the twiddle factor multiplication, and outputs the results X(k) (n=0, 1, . . . , 63), also in the bit reverse order.

The third data reordering processing part 200*c* rearranges the data X(k) outputted in the bit reverse order by the second butterfly operation processing part 21*b* into the sequential order illustrated in FIG. 6.

The data reordering processing part 200 realizes data reordering processing according to the sequential order illustrated in FIG. 6 and the bit reverse order illustrated in FIG. 7 by temporarily storing received data and controlling selection and output of the stored data. The following describes a concrete example of the data reordering processing part 200.

Figure 8:
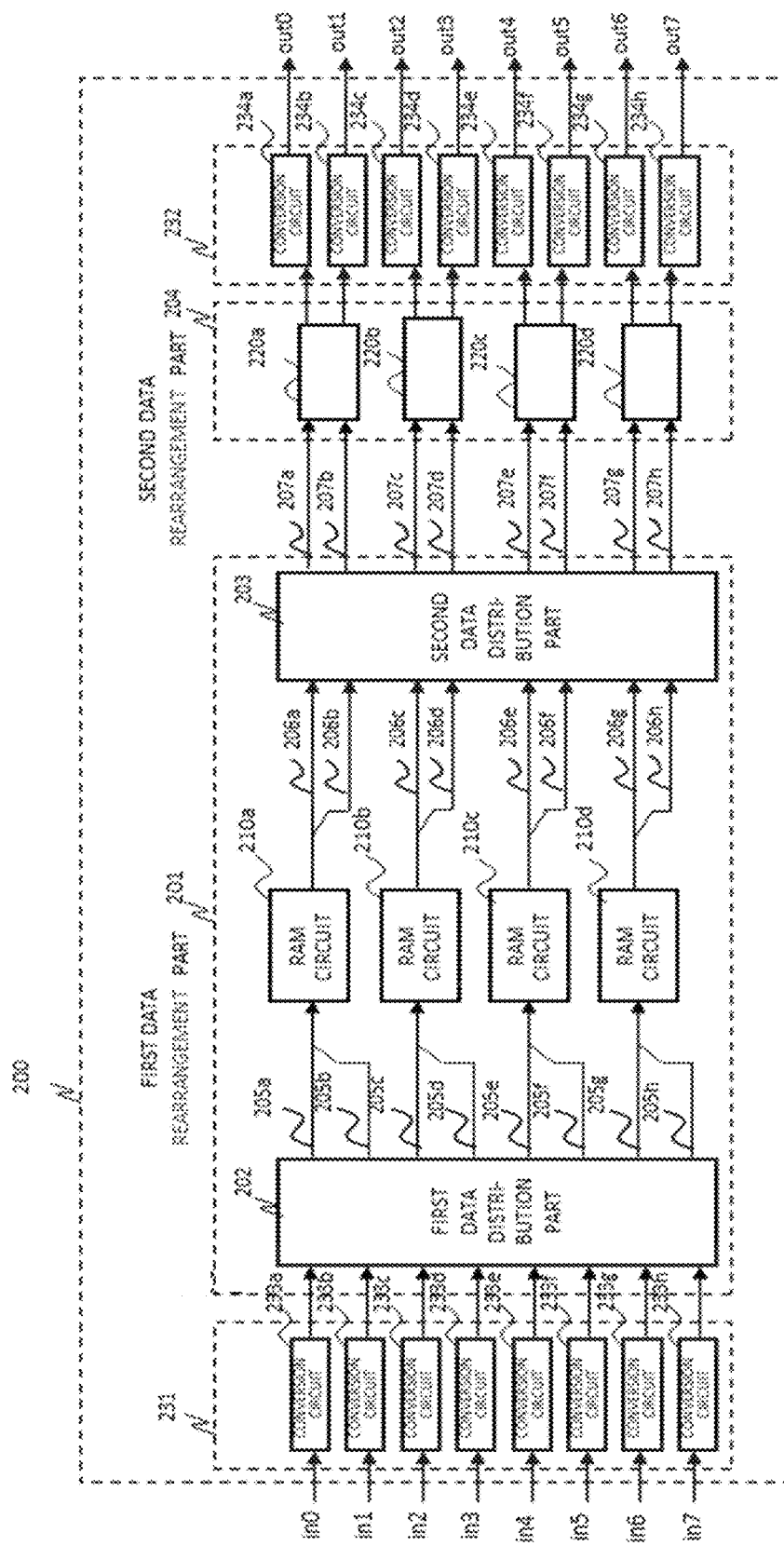
FIG. 8 is a diagram illustrating a configuration example of a data reordering processing part 220 relating to the second example embodiment of the present invention.

The first data reordering processing part 200a, the second data reordering processing part 200b, and the third data reordering processing part 200c can be realized by the data reordering processing part 200 illustrated in FIG. 8 for example.

Referring to FIG. 8, the data reordering processing part 200 includes a conversion circuit 231, a first data rearrangement part 201 (first data rearrangement means), a second data rearrangement part 204 (second data rearrangement means), and a conversion circuit 232.

The data reordering processing part 200 converts data supplied in the sequential order and represented in the two's complement representation into data represented in the sign magnitude-representation. Then, in two steps, the data reordering processing part 200 rearranges the data in the sequential order into the bit reverse order and rearranges the data in the bit reverse order into the sequential order in the sign magnitude-representation, converts the sign magnitude-representation into the two's complement representation, and outputs the results.

The following describes a concrete example of the data reordering processing from the sequential order to the bit reverse order.

The conversion circuit 231 converts data, illustrated in FIG. 9, supplied in the sequential order and represented in the two's complement representation into data in the sign magnitude-representation. Note that Ps, ps(0) to ps(7) (s=1, ..., 8) in FIG. 9 are the same as those in FIG. 6.

Figure 10:
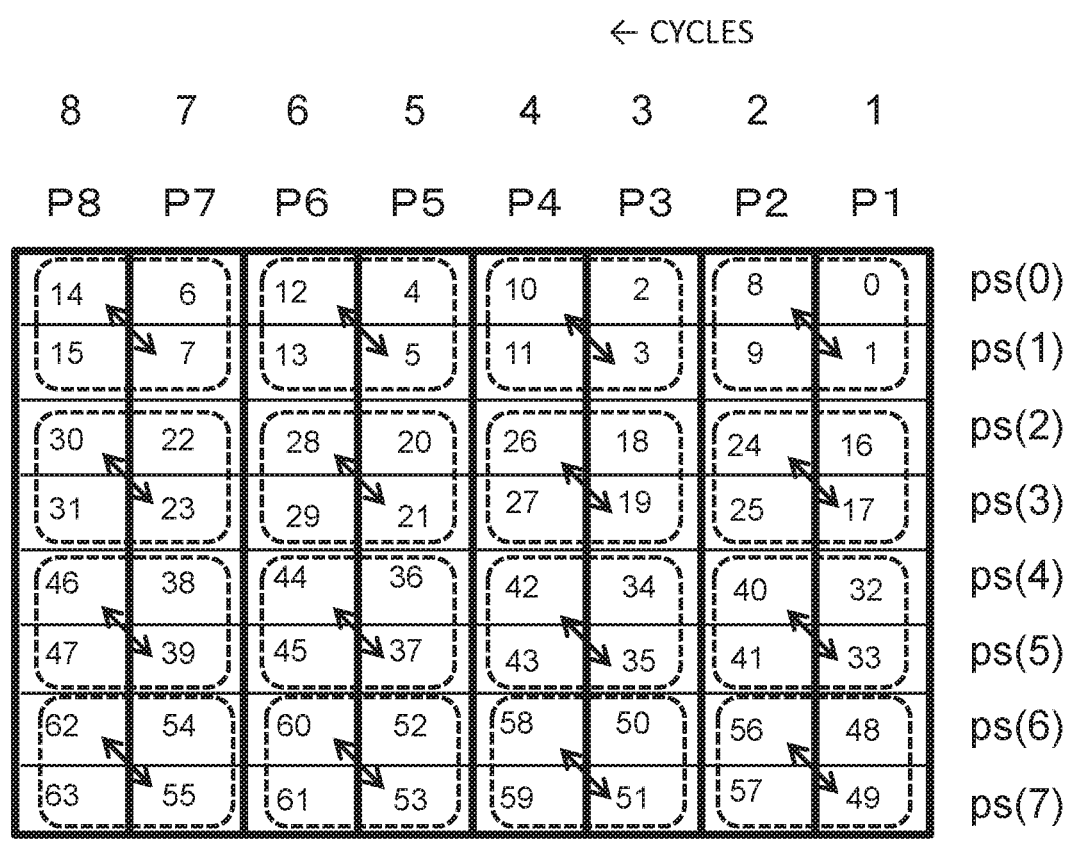
FIG. 10 is a diagram schematically illustrating the arrangement of data sets according to an intermediate order relating to the second example embodiment of the present invention.

Next, as the first step of rearrangement, the first data rearrangement part 201 rearranges the data, illustrated in FIG. 9, in the "sequential order" converted into the sign magnitude-representation by the conversion circuit 231 into data in an "intermediate order" illustrated in FIG. 10 while staying in the sign magnitude-representation.

The "intermediate order" illustrated in FIG. 10 is achieved by rearranging data sets each constituted by four pieces of data surrounded by a broken line in the "sequential order" illustrated in FIG. 9 as indicated by arrows. More in detail, the "intermediate order" illustrated in FIG. 10 is achieved by exchanging positions of the following data sets in the sequential order in FIG. 9.

A data set constituted by {2, 3, 10, 11} rearranged with a data set constituted by {16, 17, 24, 25}, A data set constituted by {4, 5, 12, 13} rearranged with a data set constituted by {32, 33, 40, 41}, A data set constituted by {6, 7, 14, 15} rearranged with a data set constituted by {48, 49, 56, 57}, A data set constituted by {20, 21, 28, 29} rearranged with a data set constituted by {34, 35, 42, 43}

A data set constituted by {22, 23, 30, 31} rearranged with a data set constituted by {50, 51, 58, 59}

A data set constituted by {38, 39, 46, 47} rearranged with a data set constituted by {52, 53, 60, 61}

Next, as the second step of rearrangement, the second data rearrangement part 204 rearranges the data in the "intermediate order" illustrated in FIG. 10 into the "bit reverse order" illustrated in FIG. 7 while staying in the sign magnitude-representation.

More in detail, in the intermediate order illustrated in FIG. 10, this can be achieved by internally rearranging data as indicated by arrows within each data set constituted by four pieces of data surrounded by a broken line. In other words, the "bit reverse order" illustrated in FIG. 7 is achieved by swapping data in the "intermediate order" illustrated in FIG. 10 as follows.

Swap between 1 and 8 in a data set constituted by {0, 1, 8, 9}

Swap between 3 and 10 in the data set constituted by {2, 3, 10, 11}

Swap between 5 and 12 in the data set constituted by {4, 5, 12, 13}

Swap between 7 and 14 in the data set constituted by {6, 7, 14, 15}

Swap between 17 and 24 in the data set constituted by {16, 17, 24, 25}

Swap between 19 and 26 in a data set constituted by {18, 19, 26, 27}

Swap between 21 and 28 in the data set constituted by {20, 21, 28, 29}

Swap between 23 and 30 in the data set constituted by {22, 23, 30, 31}

Swap between 33 and 40 in the data set constituted by {32, 33, 40, 41}

Swap between 35 and 42 in the data set constituted by {34, 35, 42, 43}

Swap between 37 and 44 in a data set constituted by {36, 37, 44, 45}

Swap between 39 and 46 in the data set constituted by {38, 39, 46, 47}

Swap between 49 and 56 in the data set constituted by {48, 49, 56, 57}

Swap between 51 and 58 in the data set constituted by {50, 51, 58, 59}

Swap between 53 and 60 in the data set constituted by {52, 53, 60, 61}

Swap between 55 and 62 in a data set constituted by {54, 55, 62, 63}

Next, the conversion circuit 232 converts the data rearranged into the "bit reverse order" by the second data rearrangement part 204 and represented in the sign magnitude-representation into data in the two's complement representation. The conversion circuit 232 is constituted by conversion circuits 233a to 233h and converts data supplied in parallel and represented in the two's complement representation into data in the sign magnitude-representation. The conversion circuits 233a to 233h may be constituted by the conversion circuits 13 illustrated in FIG. 4.

The first data rearrangement part 201 includes a first data distribution part 202, four RAM (Random Access Memory) circuits 210a, 210b, 210c, and 210d, and a second data distribution part 203.

The first data distribution part 202 simultaneously receives eight pieces of data from eight inputs in0 to in7 via the conversion circuits 233a to 233h, performs data assignment processing, and outputs the results to eight outputs 205a to 205h.

The RAM circuit 210a receives two pieces of the data outputted by the first data distribution part 202 to the outputs thereof 205a and 205b, stores these as a set, and outputs them also as two pieces of data to outputs 206a and 206b.

Similarly, the RAM circuit 210b receives two pieces of the data outputted by the first data distribution part 202 to the outputs thereof 205c and 205d, stores these as a set, and outputs them also as two pieces of data to outputs 206c and 206d.

The RAM circuit 210c receives two pieces of the data outputted by the first data distribution part 202 to the outputs thereof 205e and 205f, stores these as a set, and outputs them also as two pieces of data to outputs 206e and 206f.

The RAM circuit 210d receives two pieces of the data outputted by the first data distribution part 202 to the outputs thereof 205g and 205h, stores these as a set, and outputs them also as two pieces of data. to outputs 206g and 206h.

The second data distribution part 203 simultaneously receives eight pieces of data from eight inputs 206a to 206h, performs data assignment processing, and outputs the results to eight outputs 207a to 207h.

The second data rearrangement part 204 includes four intra-data set rearrangement part 220a to 220d.

The intra-data set rearrangement part 220a receives the data from two outputs 207a and 207b of the second data distribution part 203, performs reordering processing inside a data set constituted by four pieces of data, and outputs the result to outputs out0 and out1 via conversion circuits 234a and 234b, respectively.

Similarly, the intra-data set rearrangement part 220b receives data from two outputs 207c and 207d of the second data distribution part 203, performs reordering processing inside a data set constituted by four pieces of data, and outputs the result to outputs out2 and out3 via conversion circuits 234c and 234d, respectively.

The intra-data set rearrangement part 220c receives data from two outputs 207e and 207f of the second data distribution part 203, performs reordering processing inside a data set constituted by four pieces of data, and outputs the result to outputs out4 and out7 via conversion circuits 234g and 234h, respectively.

The intra-data set rearrangement part 220d receives data from two outputs 207g and 207h of the second data distribution part 203, performs reordering processing inside a data set constituted by four pieces of data, and outputs the result to outputs out6 and out7 via conversion circuits 234g and 234h, respectively.

The conversion circuit 232 is constituted by the conversion circuits 234a to 234h. The conversion circuits 234a to 23411 receive data represented in the sign magnitude-representation and outputted in parallel from the second data rearrangement part 204, and convert the data into two's complement values. The conversion circuits 234a to 234h may be constituted by the conversion circuit 13 illustrated in FIG. 4.

Next, a specific operation of the data reordering processing part 200 will be described. FIG. 11 is a time chart for explaining the operation of the data reordering processing part 200 illustrated in FIG. 8. The horizontal axis in FIG. 11 represents time (denoted by cycle numbers), and rows represent the data in the data lines (inputs/outputs) of the each parts in FIG. 8. In FIG. 11, element numbers 0 to 63 in an array of the cycles (columns) and the data lines (rows) denote data x(0), . . . , x(63) (for example the data in the data sets P1, . . . , P8 in FIG. 6).

The data reordering processing part 200 receives 64 pieces of data 0 to 63 in 8-data parallel in the sequential order from the inputs in0 to in7 in eight cycles t0 to t7, and outputs 64 pieces of data 0 to 63 in 8-data parallel in the bit reverse order from the outputs out0 to out7 in eight cycles t9 to t16.

First, the operation of the first data rearrangement means 201 will be described in detail. The first data rearrangement means 201 receives 64 pieces of data 0 to 63 in 8-data parallel in the sequential order in eight cycles t0 to t7, and outputs 64 pieces of data 0 to 63 in 8-data parallel in an intermediate order in eight cycles t8 to t15.

The first data distribution part 202 performs the following operation. Note that the first data distribution part 202 which is a subject of each operation is omitted.

In the cycles t0 and t1,
outputs the data received from in0 to the output 205a,
outputs the data received from in1 to the output 205b,
outputs the data received from in2 to the output 205c,
outputs the data received from in3 to the output 205d,
outputs the data received from in4 to the output 205e,
outputs the data received from in5 to the output 205f,
outputs the data received from in6 to the output 205g, and
outputs the data received from in7 to the output 205h.

In the cycles t2 and t3,
outputs the data received from in0 to the output 205c,
outputs the data received from in1 to the output 205d,
outputs the data received from in2 to the output 205e,
outputs the data received from in3 to the output 205f,
outputs the data received from in4 to the output 205g,
outputs the data received from in5 to the output 205h,
outputs the data received from in6 to the output 205a, and
outputs the data received from in7 to the output 205b.

In the cycles t4 and t5,
outputs the data received from in0 to the output 205e,
outputs the data received from in1 to the output 205f,
outputs the data received from in2 to the output 205g,
outputs the data received from in3 to the output 205h,
outputs the data received from in4 to the output 205a,
outputs the data received from in5 to the output 205b,
outputs the data received from in6 to the output 205c, and
outputs the data received from in7 to the output 205d.

In the cycles t6 and t7,
outputs the data received from in0 to the output 205g,
outputs the data received from in1 to the output 205h,
outputs the data received from in2 to the output 205a,
outputs the data received from in3 to the output 205b,
outputs the data received from in4 to the output 205c,
outputs the data received from in5 to the output 205d,
outputs the data received from in6 to the output 205e, and
outputs the data received from in7 to the output 205f.

In other words, the first data distribution part 202 performs the following operation in the cycles t0 to t7
(1) In the cycle t0, receives eight pieces of data 0 to 7 from the inputs in0 to in7, and outputs the eight pieces of data 0 to 7 to the outputs 205a to 205h, respectively.
(2) In the cycle t1, receives eight pieces of data 8 to 15 from the inputs in0 to in7, and outputs the eight pieces of data 8 to 15 to the outputs 205a to 205h, respectively.
(3) In the cycle t2, receives eight pieces of data 16 to 23 from the inputs in0 to in7, and outputs the eight pieces of data, 22 and 23 to the outputs 205a and 205b and 16 to 21 to the outputs 205c to 205h, respectively.
(4) In the cycle t3, receives eight pieces of data 24 to 31 from the inputs in0 to in7, and outputs the eight pieces of data, 30 and 31 to the outputs 205a and 205b and 24 to 29 to the outputs 205c to 205h, respectively.
(5) In the cycle t4, receives eight pieces of data 32 to 39 from the inputs in0 to in7, and outputs the eight pieces of data, 36 to 39 to the outputs 205a to 205d and 32 to 35 to the outputs 205e to 205h, respectively.
(6) In the cycle t5, receives eight pieces of data 40 to 47 from the inputs in0 to in7, and outputs the eight pieces of data, 44 to 47 to the outputs 205a to 205d and 40 to 43 to the outputs 205e to 205h, respectively.
(7) In the cycle t6, receives eight pieces of data 48 to 55 from the inputs in0 to in7, and outputs the eight pieces of data. 50 to 55 to the outputs 205a to 205f and 48 to 49 to the outputs 205g to 205h, respectively.

(8) In the cycle t7, receives eight pieces of data 56 to 63 from the inputs in0 to in7, and outputs the eight pieces of data, 58 to 63 to the outputs 205a to 205f and 56 to 57 to the outputs 205g to 205h, respectively.

Note that the sets of +eight pieces of data 0 to 7, 8 to 15, 16 to 23, 24 to 31, 32 to 39, 40 to 47, 48 to 55, and 56 to 63 in (1) to (81) above correspond to x(0) to x(7) constituting the data. set PI, x(8) to x(15) constituting the data set P2, x(16) to x(23) constituting the data set P3, x(24) to x(31) constituting the data set P4, x(32) to x(39) constituting the data set P5, x(40) to x(47) constituting the data set P6, x(48) to x(55) constituting the data set P7, and x(56) to x(63) constituting the data set P8 in FIG. 6, respectively, for example. In other words, the number n in the data represents the index n of x (n). Hereinafter, data will be denoted in the same manner.

As described above, the first data distribution part 202 performs rotation processing on eight pieces of data simultaneously received in parallel and outputs the results, and may be easily realized by, for example, a shift circuit. For example, in a register that stores and holds eight pieces of data (data: 7 bits) from in0 to in7 in parallel, eight pieces of data from in6, in7, and in0 to in5 in this order can be obtained by rotating right by two pieces of data (2×7 bits) in, for example, the cycles t2 and t3. Eight pieces of data from in4 to in7 and in0 to in3 in this order can be obtained by rotating left or right by, for example, four pieces of data (4×7 bits) in the cycles t4 and t5. In the cycles t6 and t7, eight pieces of data from int to in7 and in0 to in1 in this order can be obtained by rotating left by, for example, two pieces of data (2×7 bits). Eight pieces of data are outputted to the outputs 205a to 205h in parallel, respectively.

Next, the RAM circuit 210a performs the following operation. Note that the outputs 205a and 205b of the first data distribution part 202 are referred to as inputs 205a and 205b in the description of the RAM circuit 210a since they are connected to an input of the RAM circuit 210a. The RAM circuit 210a which is a subject of the following operation is omitted. The same applies to inputs of the RAM circuits 210b to 210d.

(1) Receives two pieces of data 0 and 1 from the inputs 205a and 205b in the cycle t0, and outputs the data to the outputs 206a and 206b in the cycle 18,
(2) Receives two pieces of data 8 and 9 from the inputs 205a and 205b in the cycle t1, and outputs the data to the outputs 206a and 206b in the cycle t9.
(3) Receives two pieces of data 22 and 23 from the inputs 205a and 205b in the cycle t2, and outputs the data to the outputs 206a and 206b in the cycle t14.
(4) Receives two pieces of data 30 and 31 from the inputs 205a and 205b in the cycle t3, and outputs the data to the outputs 206a and 206b in the cycle t15.
(5) Receives two pieces of data 36 and 37 from the inputs 205a and 205b in the cycle t4, and outputs the data to the outputs 206a and 206b in the cycle t12.
(6) Receives two pieces of data 44 and 45 from the inputs 205a and 205b in the cycle t5, and outputs the data to the outputs 206a and 206b in the cycle t13.
(7) Receives two pieces of data 50 and 51 from the inputs 205a and 205b in the cycle t0, and outputs the data to the outputs 206a and 206b in the cycle t10.
(8) Receives two pieces of data 58 and 59 from the inputs 205a and 205b in the cycle t7, and outputs the data to the outputs 206a and 206b in the cycle t11.

Similarly, the RAM circuit 210b performs the following operation.

(1) Receives two pieces of data 2 and 3 from the inputs 205c and 205d in the cycle t0, and outputs the data to the outputs 206c and 206d in the cycle t10.
(2) Receives two pieces of data 10 and 11 from the inputs 205c and 205d in the cycle t1, and outputs the data to the outputs 206c and 206d in the cycle t11.
(3) Receives two pieces of data 16 and 17 from the inputs 205c and 205d in the cycle t2, and outputs the data to the outputs 206c and 206d in the cycle t8.
(4) Receives two pieces of data 24 and 25 from the inputs 205c and 205d in the cycle t3, and outputs the data to the outputs 206c and 206d in the cycle t9.
(5) Receives two pieces of data 38 and 39 from the inputs 205c and 205d in the cycle t4, and outputs the data to the outputs 206c and 206d in the cycle t14.
(6) Receives two pieces of data 46 and 47 from the inputs 205c and 205d in the cycle t5, and outputs the data to the outputs 206c and 206d in the cycle t15.
(7) Receives two pieces of data 52 and 53 from the inputs 205c and 205d in the cycle t6, and outputs the data to the outputs 206c and 206d in the cycle t12.
(8) Receives two pieces of data 60 and 61 from the inputs 205c and 205d in the cycle t7, and outputs the data to the outputs 206c and 206d in the cycle t13.

Similarly, the RAM circuit 210c performs the following operation.

(1) Receives two pieces of data 4 and 5 from the inputs 205e and 205f in the cycle t0, and outputs the data to the outputs 206e and 206f in the cycle t12.
(2) Receives two pieces of data 12 and 13 from the inputs 205e and 205f in the cycle t1, and outputs the data to the outputs 206e and 206f in the cycle t13.
(3) Receives two pieces of data 18 and 19 from the inputs 205e and 205f in the cycle t2, and outputs the data to the outputs 206e and 206f in the cycle t10.
(4) Receives two pieces of data 26 and 27 from the inputs 205e and 205f in the cycle t3, and outputs the data to the outputs 206e and 206f in the cycle t11.
(5) Receives two pieces of data 32 and 3 3 from the inputs 205e and 205f in the cycle t4, and outputs the data to the outputs 206e and 206f in the cycle t8.
(6) Receives two pieces of data 40 and 41 from the inputs 205e and 205f in the cycle t5, and outputs the data to the outputs 206e and 206f in the cycle t9.
(7) Receives two pieces of data 54 and 55 from the inputs 205 and 205f in the cycle t6, and outputs the data to the outputs 206e and 206f in the cycle t14.
(8) Receives two pieces of data 62 and 63 from the inputs 205e and 205f in the cycle t7, and outputs the data to the outputs 206e and 206f in the cycle t15.

Similarly, the RAM circuit 210d performs the following operation.

(1) Receives two pieces of data 6 and 7 from the inputs 205g and 205h in the cycle 10, and outputs the data to the outputs 206g and 206h in the cycle t14.
(2) Receives two pieces of data 14 and 15 from the inputs 205g and 205h in the cycle tl, and outputs the data to the outputs 206g and 206h in the cycle t15.
(3) Receives two pieces of data 20 and 21 from the inputs 205g and 205h in the cycle 12, and outputs the data to the outputs 206g and 206h in the cycle t12.
(4) Receives two pieces of data 28 and 29 from the inputs 205g and 205h in the cycle t3, and outputs the data to the outputs 206g and 206h in the cycle t13.
(5) Receives two pieces of data 34 and 35 from the inputs 205g and 205h in the cycle t4, and outputs the data to the outputs 206g and 206h in the cycle t10.

(6) Receives two pieces of data 42 and 43 from the inputs 205g and 205h in the cycle t5, and outputs the data to the outputs 206g and 206h in the cycle t11.

(7) Receives two pieces of data 48 and 49 from the inputs 205g and 205h in the cycle t6, and outputs the data to the outputs 206g and 206h in the t8.

(8) Receives two pieces of data 56 and 57 from the inputs 205g and 205h in the cycle t7, and outputs the data to the outputs 206g and 206h in the cycle t9

Next, the second data distribution part 203 performs the following operation. Note that the outputs 206a to 206h of the RAM circuits 210a to 210d are referred to as inputs 206a to 206h in the description of the second data distribution part 203 since they are connected to the inputs thereof. The second data distribution part 203 which is a subject of the following operation is omitted.

In the cycles t8 and t9, outputs the data received from the nput 206a to the output 207a, outputs the data received from the input 206b to the output 207b, outputs the data received from the input 206c to the output 207c, outputs the data received from the input 206d to the output 207d, outputs the data received from the input 206e to the output 207e, outputs the data received from the input 206f to the output 207f, outputs the data received from the input 206g to the output 207g and outputs the data received from the input 206h to the output 207h.

In the cycles t10 and t11, outputs the data received from the input 206a to the output 207g, outputs the data received from the input 206b to the output 207h, outputs the data received from the input 206c to the output 207a, outputs the data received from the input 206d to the output 207b, outputs the data received from the input 206e to the output 207c, outputs the data received from the input 206f to the output 207d, outputs the data received from the input 206g to the output 207e, and outputs the data received from the input 206h to the output 207f.

In the cycles t12 and t13, outputs the data received from the input 206a to the output 207e, outputs the data received from the input 206b to the output 207f, outputs the data received from the input 206c to the output 207g, outputs the data received from the input 206d to the output 207h, outputs the data received from the input 206e to the output 207a, outputs the data received from the input 206f to the output 207b, outputs the data received from the input 206g to the output 207c, and outputs the data received from the input 206h to the output 207d.

In the cycles t14 and t15, outputs the data received from the input 206a. to the output 207c, outputs the data received from the input 206b to the output 207d, outputs the data received from the input 206c to the output 207e, outputs the data received from the input 206d to the output 207f, outputs the data received from the input 206e to the output 207g, outputs the data received from the input 206f to the output 207h, outputs the data received from the input 206g to the output 207a, and outputs the data received from the input 206h to the output 207b.

In other words, the second data distribution part 203 performs the following operation.

(1) In the cycle t0, receives eight pieces of data 0, 1, 16, 17, 32, 33, 48, and 49 from the inputs 206a to 206h, and outputs the eight pieces of data 0, 1, 16, 17, 32, 33, 48, and 49 to the outputs 207a to 207h, respectively.

(2) In the cycle t1, receives eight pieces of data 8, 9, 24, 25, 40, 41, 56, and 57 from the inputs 206a to 206h, and outputs the eight pieces of data 8, 9, 24, 25, 40, 41, 56, and 57 to the outputs 207a to 207h, respectively.

(3) in the cycle t2, receives eight pieces of data 50, 51, 2, 3, 18, 19, 34, and 35 from the inputs 206a to 206h, and outputs the eight pieces of data 2, 3, 18, 19, 34, 35, 50, and 51 to the outputs 207a to 207h, respectively.

(4) in the cycle t3, receives eight pieces of data 58, 59, 10, 11, 26, 27, 42, and 43 from the inputs 206a to 206h, and outputs the eight pieces of data 10, 11, 26, 27, 42, 43, 58, and 59 to the outputs 207a to 207h, respectively.

(5) In the cycle t4, receives eight pieces of data 36, 37, 52, 53, 4, 5, 20, and 21 from the inputs 206a to 206h, and outputs the eight pieces of data 4, 5, 20. 21, 36, 37, 52, and 53 to the outputs 207a to 207h, respectively.

(6) In the cycle t5, receives eight pieces of data 44, 45, 60, 61, 12, 13, 28, and 29 from the inputs 206a to 206h, and outputs the eight pieces of data 12, 13, 28, 29, 44, 45, 60, and 61 to the outputs 207a to 207h, respectively.

(7) In the cycle t6, receives eight pieces of data 22, 23, 38, 39, 54, 55, 6, and 7 from the inputs 206a to 206h, and outputs the eight pieces of data 6, 7, 22, 23, 38, 39, 54, and 55 to the outputs 207a to 207h, respectively.

(8) In the cycle t7, receives eight pieces of data 30, 31, 46, 47, 62, 63, 14, and 15 from the inputs 206a to 206h, and outputs the eight pieces of data 14, 15, 30, 31, 46, 47, 62, and 63 to the outputs 207a to 207h, respectively.

As the first data distribution part 202 described above, the second data distribution part 203 also performs rotation processing on eight pieces of data simultaneously received in parallel and outputs the results, and may be easily implemented by, for example, a shift circuit.

Next, the operation of the second data rearrangement part 204 will be described in detail with reference to FIG. 11. The second data. rearrangement part 204 receives 64 pieces of data 0 to 63 in 8-data parallel in the intermediate order in eight cycles t8 to t15, and outputs 64 pieces of data 0 to 63 in 8-data parallel in the bit reverse order in eight cycles t9 to t16.

The intra-data set rearrangement part 220a performs the following operation. The intra-data set rearrangement part 220a which is a subject of the following operation is omitted.

From the inputs 207a and 207b,
receives two pieces of data 0 and 1 in the cycle t8,
receives two pieces of data 8 and 9 in the cycle t9,
outputs two piece of data 0 and 8 in the cycle t9, and
outputs two pieces of data 1 and 9 in the cycle t10
to the conversion circuits 234a and 234b connected to the outputs out0 and out1, respectively.

Similarly, from the inputs 207a and 207b,
receives two pieces of data 2 and 3 in the cycle t10,
receives two pieces of data 10 and 11 in the cycle t11,
outputs two piece of data 2 and 10 in the cycle t11, and
outputs two pieces of data 3 and 11 in the cycle t12 to the conversion circuits 234a and 234b connected to the outputs out0 and out1, respectively.

From the inputs 207a and 207b,
receives two pieces of data 4 and 5 in the cycle t12,
receives two pieces of data 12 and 13 in the cycle t13,
outputs two piece of data 4 and 12 in the cycle t13, and
outputs two pieces of data 5 and 13 in the cycle t14
to the conversion circuits 234a and 234b connected to the outputs out0 and out1, respectively.

From the inputs 207a and 207b,
receives two pieces of data 6 and 7 in the cycle t14,
receives two pieces of data 14 and 15 in the cycle t15,
outputs two piece of data 6 and 14 in the cycle t15, and
outputs two pieces of data 7 and 15 in the cycle t16
to the conversion circuits 234a and 234b connected to the outputs out0 and outs, respectively.

The intra-data set rearrangement part 220b performs the following operation. The intra-data set rearrangement part 220b which is a subject of the following operation is omitted.

From the inputs 207c and 207d,
receives two pieces of data 16 and 17 in the cycle t8,
receives two pieces of data 24 and 25 in the cycle t9,
outputs two piece of data 16 and 24 in the cycle t9, and
outputs two pieces of data 17 and 25 in the cycle t10
to the conversion circuits 234c and 234d connected to the outputs out2 and out3, respectively.

Similarly,
from the inputs 207c and 207d,
receives two pieces of data 18 and 19 in the cycle t10,
receives two pieces of data 26 and 27 in the cycle t11,
outputs two piece of data 18 and 26 in the cycle t11, and
outputs two pieces of data 19 and 27 in the cycle t12
to the conversion circuits 234c and 234d connected to the outputs out2 and out3, respectively.

From the inputs 207c and 207d,
receives two pieces of data 20 and 21 in the cycle t12,
receives two pieces of data 28 and 29 in the cycle t13,
outputs two piece of data 20 and 28 in the cycle t13, and
outputs two pieces of data 21 and 29 in the cycle t14
to the conversion circuits 234c and 234d connected to the outputs out2 and out3, respectively.

From the inputs 207c and 207d,
receives two pieces of data 22 and 23 in the cycle t14,
receives two pieces of data 30 and 31 in the cycle t15,
outputs two piece of data 22 and 30 in the cycle t15, and
outputs two pieces of data 23 and 31 in the cycle t16
to the conversion circuits 234c and 234d connected to the outputs out2 and out3, respectively.

The intra-data set rearrangement part 220c performs the following operation. The intra-data set rearrangement part 220c which is a subject of the following operation is omitted.

From the inputs 207e and 207f,
receives two pieces of data 32 and 33 in the cycle t8,
receives two pieces of data 40 and 41 in the cycle t9,
outputs two piece of data 32 and 40 in the cycle t9, and
outputs two pieces of data 33 and 41 in the cycle t10
to the conversion circuits 234e and 234f connected to the outputs out4 and out5, respectively.

Similarly,
from the inputs 207e and 207f,
receives two pieces of data 34 and 35 in the cycle t10,
receives two pieces of data 42 and 43 in the cycle t11,
outputs two piece of data 34 and 42 in the cycle t11, and
outputs two pieces of data 35 and 43 in the cycle t12
to the conversion circuits 234e and 234f connected to the outputs out4 and out5, respectively.

From the inputs 207e and 207f,
receives two pieces of data 36 and 37 in the cycle t12,
receives two pieces of data 44 and 45 in the cycle t13,
outputs two piece of data 36 and 44 in the cycle t13, and
outputs two pieces of data 37 and 45 in the cycle t14
to the conversion circuits 234e and 234f connected to the outputs out4 and out5, respectively.

From the inputs 207e and 207f,
receives two pieces of data 38 and 39 in the cycle t14,
receives two pieces of data 46 and 47 in the cycle t15,
outputs two piece of data 38 and 46 in the cycle t15, and
outputs two pieces of data 39 and 47 in the cycle t16
to the conversion circuits 234e and 234f connected to the outputs out4 and out5, respectively.

The intra-data set rearrangement part 220d performs the following operation. The intra-data set rearrangement part 220d which is a subject of the following operation is omitted.

From the inputs 207g and 207h,
receives two pieces of data 48 and 49 in the cycle t8,
receives two pieces of data 56 and 57 in the cycle t9,
outputs two piece of data 48 and 56 in the cycle t9, and
outputs two pieces of data 49 and 57 in the cycle t10
to the conversion circuits 234g and 234h connected to the outputs out6 and out7, respectively.

Similarly, from the inputs 207g and 207h,
receives two pieces of data 50 and 51 in the cycle t10,
receives two pieces of data 58 and 59 in the cycle t11,
outputs two piece of data 50 and 58 in the cycle t11, and
outputs two pieces of data 51 and 59 in the cycle t12
to the conversion circuits 234g and 234h connected to the outputs out6 and out7, respectively.

From the inputs 207g and 207h,
receives two pieces of data 52 and 53 in the cycle t12,
receives two pieces of data 60 and 61 in the cycle t13,
outputs two piece of data 52 and 60 in the cycle t13, and
outputs two pieces of data 53 and 61 in the cycle t14
to the conversion circuits 234g and 234h connected to the outputs out6 and out7, respectively.

From the inputs 207g and 207h,
receives two pieces of data 54 and 55 in the cycle t14,
receives two pieces of data 62 and 63 in the cycle t15,
outputs two piece of data 54 and 62 in the cycle t15, and
outputs two pieces of data 55 and 63 in the cycle t16
to the conversion circuits 234g and 234h connected to the outputs out6 and out7, respectively.

As described above, the data reordering processing part 200 achieves rearrangement from the sequential order to the bit reverse order by having the first data rearrangement part 201 rearrange the sequential order into the intermediate order and having the second data rearrangement part 204 rearrange the intermediate order into the bit reverse order.

Figure 12:
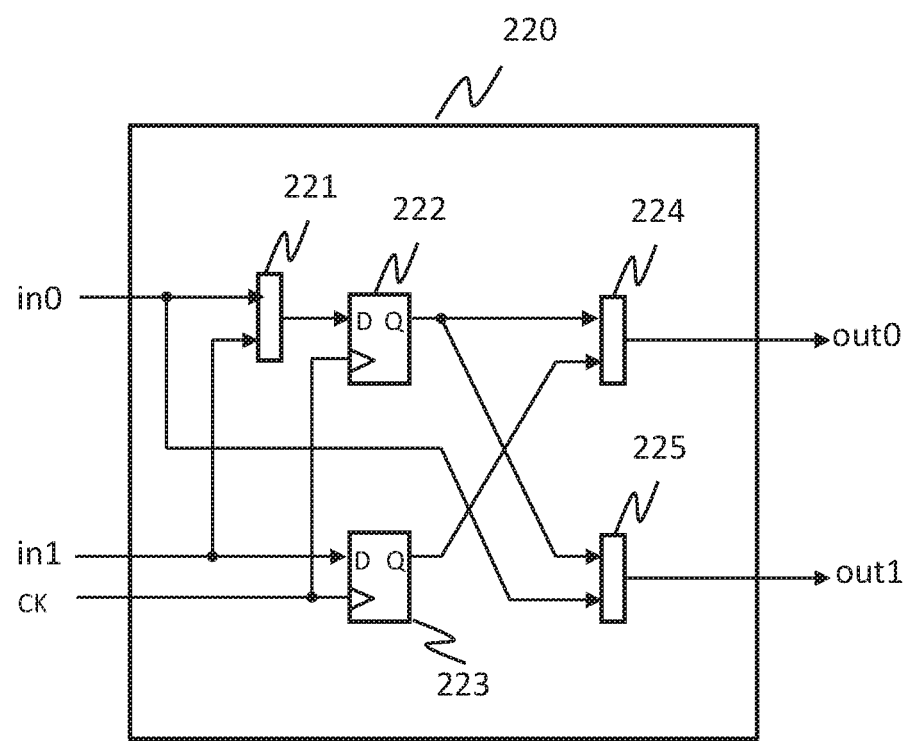
FIG. 12 is a diagram illustrating a configuration example of an intra-data set rearrangement part 220 relating to the second example embodiment of the present invention.

For example, the intra-data set rearrangement parts 220a to 220d constituting the second data rearrangement part 204 may be realized by an intra-data set rearrangement part 220 illustrated in FIG. 12. Referring to FIG. 12, the intra-data set rearrangement part 220 is constituted by selector circuits 221, 224, and 225, and flip-flops 222 and 223.

FIG. 13 is a time chart for explaining the operation of the intra-data set rearrangement part 220. In FIG. 13, the intra-data set rearrangement part 220 receives four pieces of data 0, 1, 8, and 9 as a data set from inputs in0 and int in cycles t0 and t1, rearranges the pieces within the data set, and outputs four pieces of data 0, 8, 1, and 9 from outputs out0 and out1 in the cycle t1 and cycle t2.

More specifically, the intra-data set rearrangement part 220 receives two pieces of data 0 and 1 from the inputs in0 and in1 in the cycle t0, and the selector 221 selects and outputs 0 received from the input in0. In the cycle to, the flip-flop 222 stores 0 selected and outputted by the selector 221. The flip-flop 223 stores 1 received from the input in1.

In the next cycle t1, the intra-data set rearrangement part 220 receives two pieces of data 8 and 9 from the inputs in0 and in1, and the selector 221 selects and outputs 9 received from the input in1. In the cycle t1, the flip-flop 222 outputs 0 stored in the cycle to and stores 9 received from the input in1. The flip-flop 223 outputs 1 stored in the cycle t0.

In the next cycle tl, the selector 224 selects 0 outputted by the flip-flop 222 and outputs it to the output out0. The selector 225 selects 8 received from the input in0 and outputs it to the output out1.

In the cycle t2, the flip-flop 222 outputs 9 stored therein. The flip-flop 223 outputs 1 stored therein.

In the cycle t2, the selector 224 selects 1 outputted by the flip-flop 223 and outputs it to the output out0. The selector 225 selects 9 outputted by the flip-flop 222 and outputs it to the output out1. The flip-flops 222 and 223 may be master-slave flip-flops that store data at a data terminal at the rising of a clock signal (clock pulse) CK for each cycle and output the data from an output terminal Q at the falling of the clock pulse, without being limited thereto. Alternatively, for example, the flip-flops 222 and 223 may be constituted by edge-triggered flip-flops that output data at a data terminal D from an output terminal Q in response to the rising edge (or rising) of the clock pulse.

The data reordering processing was described using rearrangement from the sequential order to the bit reverse order as an example, however, rearrangement from the bit reverse order to the sequential order may also be achieved in two steps by rearranging data from the bit reverse order to the intermediate order as the first-step rearrangement after the data has been converted into the sign magnitude-representation, and then rearranging the intermediate order into the sequential order as the second-step rearrangement.

The Effect of the Second Example Embodiment

As described, in the present example embodiment, the FFT apparatus 20 achieves rearrangement from the "sequential order" to the "bit reverse order" and rearrangement from the "bit reverse order" to the "sequential order," which are data reordering processing required in a butterfly operation, in two steps going through the "intermediate order" after conversion into the sign magnitude-representation. As a result, the percentage-activity of the RAM circuits constituting the first data rearrangement part 201 and the second data rearrangement part 204, the flip-flop circuits, and the selector circuits can be reduced, compared with a case where the reordering processing takes place without converting the two's complement representation.

The conversion processing between the two's complement representation and the sign magnitude-representation can be achieved only with bit inversion, and one-addition processing (increment processing), which is necessary in the sign magnitude representation, is not required.

Since a bit inversion circuit can be created only with an XOR circuit, it can be implemented with an overwhelmingly small circuit scale, compared with other logic processing circuits and operation processing circuits.

Therefore, in the present example embodiment, even when a signal whose value frequently changes between positive and negative in the vicinity of zero is processed, the percentage-activity in the data reordering processing can be kept to a minimum, thereby reducing the power consumption in the data reordering processing part.

On the other hand, in the present example embodiment, the butterfly operation processing part and the twiddle factor multiplication processing part perform butterfly operation processing and twiddle factor multiplication in the two's complement representation.

Therefore, the percentage-activity related to these arithmetic processes is not reduced. The conversion between the data representation formats, however, does not increase the circuit scale unlike in the case where the sign magnitude representation is applied.

Therefore, the power consumption of the entire FFT apparatus can be reduced by the amount that the power consumption related to the data reordering processing is reduced.

Figure 18:
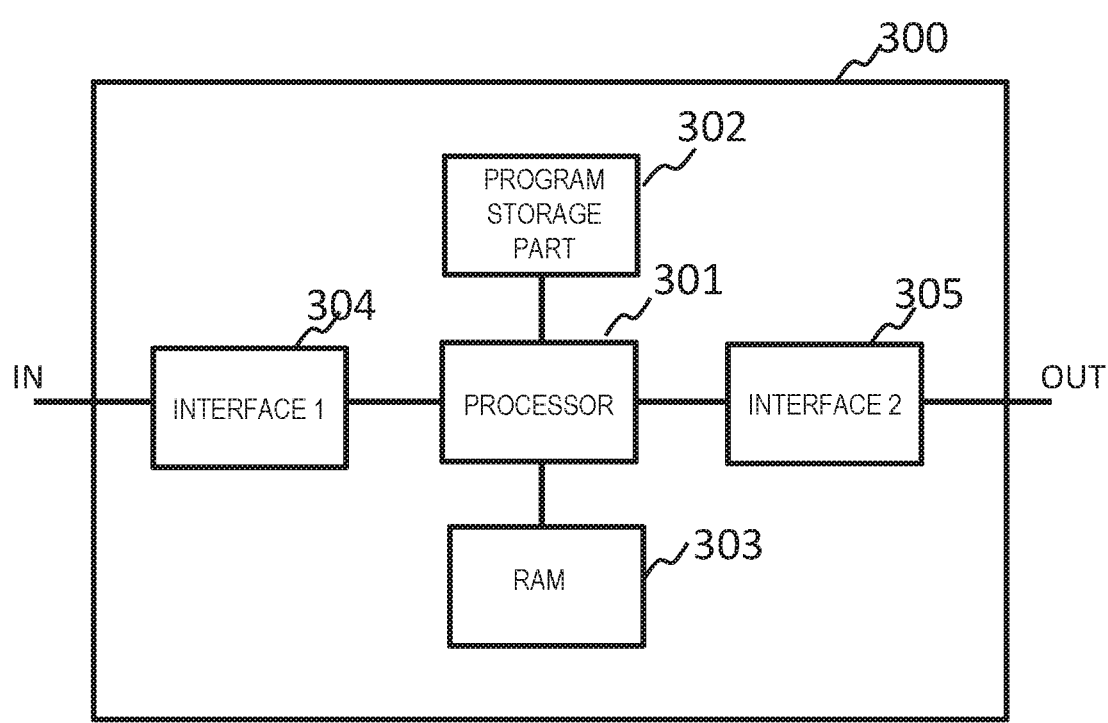
FIG. 18 is a diagram illustrating a mode of a computer program relating to the present invention.

FIG. 18 is a drawing schematically illustrating a mode in which a program realizes the processing and functions of the apparatuses 10 and 20 according to the first and the second example embodiments. Referring to FIG. 18, a processor apparatus 300 comprises a processor 301, a program storage part 302 that stores a program (instructions, data, etc. executed by the processor 301, a RAM 303 (that may function as the RAM circuit 210 of the second example embodiment illustrated in FIG. 8) to/from which the processor 301 writes/reads data, a first interface (interface 1) 304 that receives input data from an input terminal IN and supplies the data to the processor 301, and a second interface (interface 2) 305 that receives data outputted from the processor 301 and outputs the data from an output terminal OUT. The processor 301 may be a digital signal processor or an FFT processor for wireless communication. The program storage part 302 may be a ROM (Read-Only Memory), EEPROM (Electrically Erasable Programmable Read-Only Memory), HDD (Hard Disk Drive), or USB (Universal Serial Bus) memory, etc. The program storage part 302 may be configured to store the firmware of the processor 301. The RAM 303 may be configured to be built into the processor 301. The first interface 304 may be configured to comprise an input circuit (or receiving circuit) and an input buffer (receiving buffer) and the second interface 305 may be configured to comprise an output buffer (transmission buffer) and an output circuit (transmission circuit). The first and the second interfaces 304 and 305 may be integrated into a single interface circuit comprising an input/output circuit (transceiver). The same effects as those of the first and the second example embodiments can be obtained by causing the processor 301 to execute the program stored in the program storage part 302. Note that FIG. 18 illustrates the configuration of the processor apparatus 300 with the parts 301 to 305 merely for the sake of description, however, it goes without saying that some or all of these parts may be included in the processor 301 to form a single chip.

It is noted that each disclosure of Patent Literatures 1 to 3 and Non-Patent Literatures 1 and 2 cited above is incorporated herein in its entirety by reference thereto. It is to be noted that it is possible to modify or adjust the example embodiments or examples within the whole disclosure of the present invention (including the Claims) and based on the basic technical concept thereof. Further, it is possible to variously combine or select a wide variety of the disclosed elements (including the individual elements of the individual claims, the individual elements of the individual examples and the individual elements of the individual figures) within the scope of the Claims of the present invention. That is, it is self-explanatory that the present invention includes any types of variations and modifications to be done by a skilled person according to the whole disclosure including the Claims, and the technical concept of the present invention.

REFERENCE SIGNS LIST

10: signal processing apparatus
11, 11a, 11b, 11c: storage processing part
12a, 12b: operation processing part
13, 13a, 13b: conversion circuit
14: storage circuit
17: XOR circuit
20: FFT apparatus
21a, 21b: butterfly operation processing part
22: twiddle factor multiplication processing part
200, 200a to 200c: data reordering processing part
200: data reordering processing part
201: first data rearrangement part (means)
202: first data distribution part
203: second data distribution part
204: second data rearrangement part (means)
205a to 205h: output (output data of first data distribution part)
206a to 205h: output (output data of RAM circuit)
207a to 207h: output (output data of the second data distribution part)
210a to 210d: RAM circuit
220: intra-data set rearrangement part
220a to 220d: intra-data set rearrangement part
221, 224, 225: selector circuit
222, 223: flip-flop
231, 232, 233a to 233h, 234a to 234h: conversion circuit
300: processor apparatus
301: processor
302: program storage part
303: RAM
304: first interface
305: second interface
500: data flow
501: data reordering processing part
502, 503: butterfly operation processing part
504: twiddle factor multiplication processing part
505a to 505h: partial data flow
600: conversion circuit
601: bit inversion circuit
602: one-addition circuit

The invention claimed is:
1. A signal processing apparatus performing fast Fourier transform or inverse fast Fourier transform comprising:
a butterfly operation processing circuit that performs butterfly operation processing on a plurality of pieces of data in a two's complement representation, implemented by a hardware processing circuit and/or a signal processor;
a twiddle factor multiplication processing circuit that performs twiddle factor multiplication processing on the plurality of pieces of data in the two's complement representation, implemented by a hardware processing circuit and/or the signal processor; and
a data reordering processing part that rearranges an order of the plurality of pieces of data represented in a second representation format, from a sequential order to a bit reverse order or from the bit reverse to the sequential order,
wherein, in the second representation format, a data value of each of the plurality of pieces of data is identical to one in the two's complement representation when the data value is positive or zero, and all bits lower than a most significant bit indicating a sign in the each of the plurality of pieces of data in the two's complement representation are inverted when the data value is negative,
wherein the signal processing apparatus executes N×N (N is a power of 2) points fast Fourier transform or inverse fast Fourier transform,
wherein the data reordering processing part includes first to third data reordering processing parts, as the data reordering processing part, each of the first to third data reordering processing parts having a random access memory,
wherein the butterfly operation processing circuit includes first and second butterfly processing circuits, as the butterfly operation processing circuit,
wherein the first data reordering processing part receives in parallel N pieces of data for N cycles supplied in the sequential order, stores the N pieces of data for N cycles in the random access memory thereof, and rearranges the order of the N pieces of data for N cycles into a bit reversal order to output the N pieces of resulting data in parallel for N cycles, where the N pieces of data is the plurality of data,
wherein the first butterfly processing circuit performs butterfly operation on the N pieces of data output in parallel from the first data reordering processing part to output in parallel the N pieces of resulting data, where the N pieces of data is the plurality of data,
wherein the second data reordering processing part receives in parallel the N pieces of data for N cycles output in the sequential order from the first butterfly processing circuit, stores the N pieces of data for N cycles in the random access memory thereof and rearranges the order of the N pieces of data for N cycles into a bit reversal order to output N pieces of resulting data in parallel for N cycles, where the N pieces of data is the plurality of data,
wherein the twiddle factor multiplication processing circuit multiplies the N pieces of data output from the second data reordering processing part by corresponding twiddle factor coefficients to output in parallel the N pieces of resulting data, where the N pieces of data is the plurality of data,
wherein the second butterfly processing circuit performs butterfly operation on the N pieces of data output in parallel from the twiddle factor multiplication processing circuit to output N pieces of resulting data in parallel, where the N pieces of data is the plurality of data, and wherein the third data reordering processing part receives in parallel the N pieces of data for N cycles output in bit reversal order from the second butterfly processing circuit, stores the N pieces of data for N cycles in a random access memory thereof and rearranges the order of the N pieces of data for N cycles into a sequential order to output the N pieces of resulting data in parallel for N cycles, where the N pieces of data is the plurality of data.

2. The signal processing apparatus according to claim 1, wherein each of the first to third data reordering processing parts comprises:

a first conversion processing part that converts a data representation format of each of the N pieces of data received in the two's complement representation to the second representation format to output the N pieces of data in parallel;

each of the first to third data reordering processing parts that rearranges the order of the N pieces of data represented in the second representation format; and a second conversion processing part that converts a data representation format of the N pieces of data undergoing the data reordering processing from the second representation format to the two's complement representation to output the N pieces of data undergoing the data reordering processing in the two's complement representation.

3. The signal processing apparatus according to claim 2, wherein the first and the second conversion processing parts, directly output the most significant bit of the each of the plurality pieces of data, and output an exclusive OR of the most significant bit and each of bits lower than the most significant bit of the each of the plurality pieces of data with respect to the bits lower than the most significant bit as the resulting data.

4. The signal processing apparatus according to claim 1, wherein each of the first to third data reordering processing parts, includes a first conversion processing part that receives the N pieces of data for N cycles and converts a data representation format of each of the N pieces of data received in the two's complement representation to the second representation format to output the N pieces of data in parallel;

a first data distribution part that increases an amount of shift by two data points sequentially from 0, every two cycles from the first cycle to the Nth cycle of the N pieces of data output in parallel from the first conversion part to output in parallel the N pieces of data cyclically shifted;

the random access memory that stores N cycles of the N pieces of data output in parallel from the first data distribution part for N rows and N columns, and outputs data from the first row to the Nth column in parallel in each N rows, after replacing corresponding columns for N/2 rows and N/2 columns with adjacent 2×2 data pairs as element units;

a second data distribution part that outputs the N pieces of data in parallel, cyclically shifted in an opposite direction of the first data distribution part, by sequentially increasing a shift amount by 2 pieces of data from 0 every 2 cycles, from the first cycle to N cycles of the N pieces of data output sequentially in parallel from the random access memory, for the N cycles of the N pieces of data output in parallel from the second data distribution part being a matrix of N/2 rows and N/2 columns with adjacent 2×2 data pairs as element units, the matrix being equivalent to replacing the elements of adjacent 2×2 data pairs symmetrically to diagonal components of a matrix of N/2 rows and N/2 columns with adjacent 2×2 data pairs as element units; and N/2 reordering parts, for each of N/2 data set, consisting of two adjacent pairs of the N pieces of data output in parallel from the second data distribution part, the N/2 reordering parts each rearranging data between second data of a previous cycle and a first data of a later cycle in a 2×2 data consisting of two consecutive cycles to output N/2 data sets in parallel for each cycle, wherein j-th data of an i-th cycle output from the N/2 reordering part in parallel, is the i-th data of the j-th cycle of the N pieces of data input for N cycles, and a second conversion processing part that converts a data representation format of the N pieces of data undergoing the data reordering processing from the second representation format to the two's complement representation to output the N pieces of data undergoing the data reordering processing in the two's complement representation.

\* \* \* \* \*